(12) United States Patent
Kurihara et al.

(10) Patent No.: US 11,387,716 B2
(45) Date of Patent: Jul. 12, 2022

(54) REDUNDANT CIRCUIT DEVICE

(71) Applicant: DENSO CORPORATION, Kariya (JP)

(72) Inventors: Jyun Kurihara, Kariya (JP); Hiroyasu Sugiura, Kariya (JP)

(73) Assignee: DENSO CORPORATION, Kariya (JP)

( * ) Notice: Subject to any disclaimer, the term of this patent is extended or adjusted under 35 U.S.C. 154(b) by 238 days.

(21) Appl. No.: 16/874,651

(22) Filed: May 14, 2020

(65) Prior Publication Data
US 2020/0366166 A1    Nov. 19, 2020

(30) Foreign Application Priority Data

May 17, 2019   (JP) .............................. JP2019-093612

(51) Int. Cl.
| | |
|---|---|
| *H02K 11/33* | (2016.01) |
| *B62D 5/04* | (2006.01) |
| *B62D 15/02* | (2006.01) |
| *H05K 1/02* | (2006.01) |
| *H02K 11/215* | (2016.01) |

(52) U.S. Cl.
CPC ............. *H02K 11/33* (2016.01); *B62D 5/046* (2013.01); *B62D 5/0406* (2013.01); *B62D 15/0235* (2013.01); *H02K 11/215* (2016.01); *H05K 1/0231* (2013.01); *H05K 2201/1009* (2013.01)

(58) Field of Classification Search
CPC .. H02K 11/33; H02K 11/215; H02K 2211/03; B62D 5/0406; B62D 5/046; B62D 15/0235; H05K 1/0231; H05K 2201/1009; H05K 1/029; H05K 1/025; H05K 1/0298; H05K 1/0203; H05K 1/181; H05K 2201/0979; H05K 2201/09972; H05K 2201/10151; H02P 27/06; H02P 6/30; H02P 25/18; H02M 7/53871
See application file for complete search history.

(56) References Cited

U.S. PATENT DOCUMENTS

| | | |
|---|---|---|
| 2016/0036288 A1 | 2/2016 | Yamasaki et al. |
| 2019/0152524 A1 | 5/2019 | Fujita et al. |

OTHER PUBLICATIONS

U.S. Appl. No. 16/874,652, filed May 14, 2020, Sugiura, and its entire file history.
U.S. Appl. No. 16/874,655, filed May 14, 2020, Sugiura, and its entire file history.
U.S. Appl. No. 16/874,656, filed May 14, 2020, Abe et al., and its entire file history.

*Primary Examiner* — Mohamad A Musleh
(74) *Attorney, Agent, or Firm* — Maschoff Brennan

(57) ABSTRACT

A redundant circuit device including a first system circuit and a second system circuit having identical function, the redundant circuit device comprises: a substrate that is partitioned into a first region in which a part of the first system circuit is provided and a second region in which a part of the second system circuit is provided, each of the first region and the second region having a printed wiring; a first mount component that is included in the first system circuit, has three or more pins, and is surface-mounted on one surface of the substrate; and a second mount component that is included in the second system circuit, has an identical number of pins as that of the first mount component and having an identical function as that of the first mount component, and is surface-mounted on the one surface.

12 Claims, 12 Drawing Sheets

REDUNDANT CIRCUIT DEVICE

CROSS REFERENCE TO RELATED APPLICATION

The present application is based on Japanese Patent Application No. 2019-093612 filed on May 17, 2019, the disclosure of which is incorporated herein by reference.

TECHNICAL FIELD

The present disclosure relates to a redundant circuit device with a redundant function.

BACKGROUND

A related art discloses a redundant circuit device in which functions are made redundant by providing a first system circuit and a second system circuit having the same function. In the above device, the first system circuit and the second system circuit each include a microcomputer having the same function.

SUMMARY

The present disclosure describes a redundant circuit device including a first system circuit and a second system circuit having identical function. The redundant circuit device comprises: a substrate that is partitioned into a first region in which at least a part of the first system circuit is provided and a second region in which at least a part of the second system circuit is provided; a first mount component that is included in the first system circuit, has three or more pins, and is surface-mounted on the one surface of the substrate; and a second mount component that is included in the second system circuit, has an identical number of pins as that of the first mount component and having an identical function as that of the first mount component, and is surface-mounted on the one surface of the substrate.

BRIEF DESCRIPTION OF DRAWINGS

Objects, features and advantages of the present disclosure will become more apparent from the following detailed description made with reference to the accompanying drawings. In the drawings.

DETAILED DESCRIPTION

Figure 1:
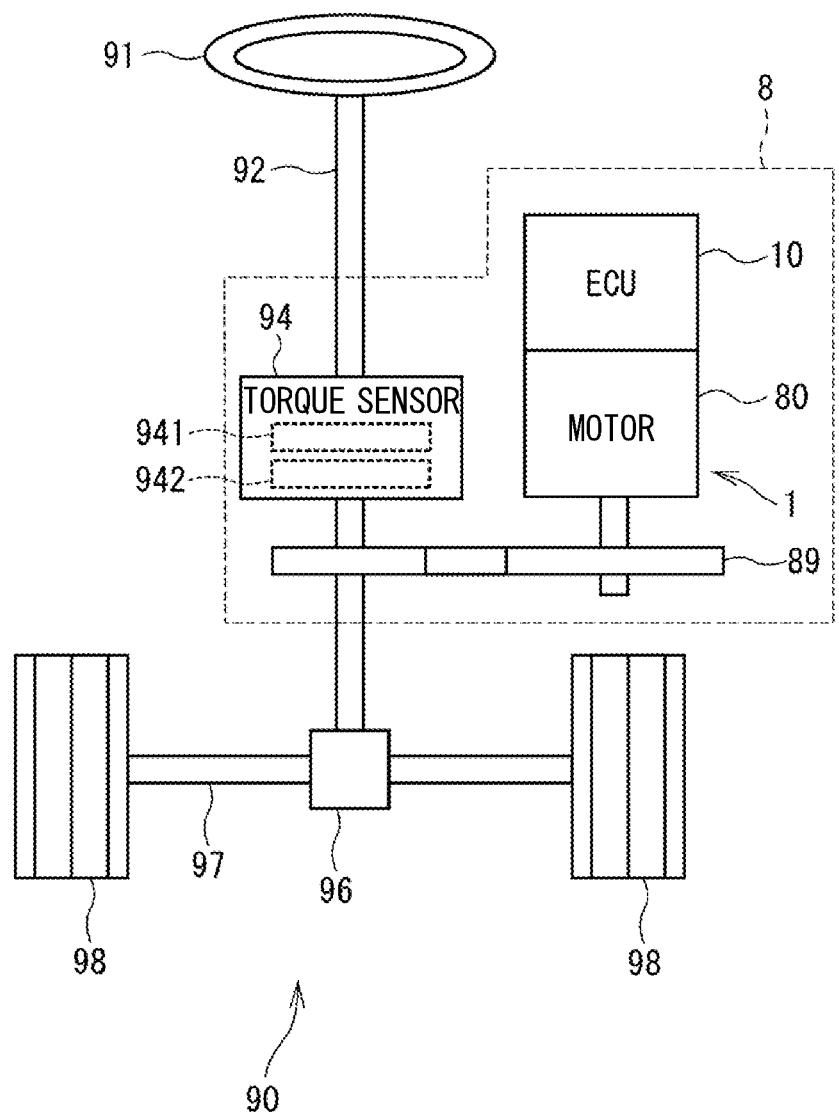
FIG. 1 is a schematic configuration diagram showing a steering system according to a first embodiment.

In the configuration of a related art, a first mount component such as a microcomputer included in the first system circuit and a second mount component such as a microcomputer included in the second system circuit may be mounted on a single common substrate. In addition, the above substrate may be divided into a first region in which the first mount component is provided and a second region in which the second mount component is provided. In that case, it may be ideal that a pattern of a printed wiring formed in the first region and a pattern of a printed wiring formed in the second region have the identical wiring length and the identical width. This is because an impedance of the printed wiring and a noise emitted from the printed wiring can be made identical between both the systems.

If the impedance varies in both the systems, the amount of heat generated in the printed wiring may vary in both the systems, and a heat radiation design suitable for a system having a larger heat generation amount may be required. When a level of the emission noise varies between both the systems, a noise countermeasure suitable for a system having a larger noise level may be required.

The present disclosure describes a redundant circuit device capable of reducing variations in the shape and size of a printed wiring in both systems.

According to one aspect of the present disclosure, a redundant circuit device including a first system circuit and a second system circuit having identical function to make the function be redundant may comprise a substrate, a first mount component, and a second mount component. The substrate that is partitioned into a first region in which at least a part of the first system circuit is provided and a second region in which at least a part of the second system circuit is provided, and has one surface, each of the first region and the second region having a printed wiring. The first mount component that is included in the first system circuit, has three or more pins, and is surface-mounted on the one surface of the substrate. The second mount component that is included in the second system circuit, has an identical number of pins as that of the first mount component and having an identical function as that of the first mount component, and is surface-mounted on the one surface of the substrate. A placement of numbers assigned by function to the respective pins of the first mount component with respect to a center point of the first mount component is defined as a first pin placement. A placement of numbers assigned by function to the respective pins of the second mount component with respect to a center point of the second mount component is defined as a second pin placement. The second pin placement is a mirror inversion of the first pin placement.

The pattern of the printed wiring connected to each pin of the first mount component is referred to as a first pattern. The pattern of the printed wiring connected to each pin of the second mount component is referred to as a second pattern.

In the device according to a first aspect, a pin placement is mirror-inverted between the second mount component and the first mount component. For that reason, the first pattern and the second pattern can be easily designed to have a shape and size mirror-inverted with respect to a boundary line between the first region and the second region as a symmetry axis. Therefore, a variation in impedance in both the patterns can be reduced, and a variation in noise level in both the patterns can be reduced. For that reason, optimization of a heat radiation design and a noise countermeasure can be promoted.

According to another aspect of the present disclosure, a redundant circuit device including a first system circuit and a second system circuit having identical function to make the function be redundant may comprise a substrate, a first mount component, and a second mount component. The substrate that is partitioned into a first region in which at least a part of the first system circuit is provided and a second region in which at least a part of the second system circuit is provided, and has one surface, each of the first region and the second region having a printed wiring. The first mount component that is included in the first system circuit, has three or more pins, and is surface-mounted on the one surface of the substrate. The second mount component that is included in the second system circuit, has an identical number of pins as that of the first mount component and having an identical function as that of the first mount component, and is surface-mounted on the one surface of the substrate. A placement of numbers assigned by function to the respective pins included in the first mount component with respect to a center point of the first mount component is defined as a first pin placement. A placement of numbers assigned by function to the respective pins included in the second mount component with respect to a center point of the second mount component is defined as a second pin placement. The first pin placement is identical with the second pin placement. The pins included in the first mount component has a first reference pin, which has a predetermined function. The pins included in the second mount component has a second reference pin, which has the predetermined function. A direction of the first mount component on the substrate, which is specified by a position of the first reference pin around a center of the first mount component, is defined as a first mounting direction. A direction of the second mount component on the substrate, which is specified by a position of the second reference pin around a center of the second mount component, is defined as a second mounting direction. The first mounting direction and the second mounting direction are different from each other.

In the device according to a second aspect, the second mount component and the first mount component have the same pin placement, and a first mounting direction and a second mounting direction are different from each other. For that reason, the first pattern and the second pattern can be easily designed to have a shape and size mirror-inverted with respect to a boundary line between the first region and the second region as a symmetry axis. Therefore, a variation in impedance in both the patterns can be reduced, and a variation in noise level in both the patterns can be reduced. For that reason, optimization of a heat radiation design and a noise countermeasure can be promoted.

Hereinafter, multiple embodiments according to the present disclosure will be described with reference to the drawings. Incidentally, the same reference numerals are assigned to corresponding components in each embodiment, and therefore duplicate descriptions may be omitted. When only a part of the configuration is described in each embodiment, the configuration of the other embodiments described above can be applied to other parts of the configuration.

First Embodiment

As shown in FIG. 1, a drive device 1 according to the present embodiment includes an electric motor 80 and an electronic control unit (ECU) 10 as a power conversion device. The ECU 10 corresponds to an example of the power conversion device. The drive device 1 is applied to an electric power steering device (EPS) 8 for assisting steering operation of a vehicle. FIG. 1 shows an entire configuration of a steering system 90 including the EPS 8. The steering system 90 includes a steering wheel 91 as a steering member, a steering shaft 92, a pinion gear 96, a rack shaft 97, wheels 98, the EPS 8, and the like.

The steering wheel 91 is connected to the steering shaft 92. The steering shaft 92 is provided with a torque sensor 94 for detecting a steering torque. The torque sensor 94 has two torque detection units 941 and 942 provided for each system. Detection values of the torque detection units 941 and 942 are output to the microcomputers 170 and 270, which are corresponding microcomputers (see FIG. 3). The pinion gear 96 is provided at a tip of the steering shaft 92. The pinion gear 96 meshes with the rack shaft 97. The pair of wheels 98 is connected to both ends of the rack shaft 97 through tie rods or the like.

When a driver rotates the steering wheel 91, the steering shaft 92 connected to the steering wheel 91 rotates. A rotational motion of the steering shaft 92 is converted into a linear motion of the rack shaft 97 by the pinion gear 96. The pair of wheels 98 are steered to an angle corresponding to the amount of displacement of the rack shaft 97.

The EPS 8 includes the drive device 1, a reduction gear 89 as a power transmission portion for reducing a rotational speed of the motor 80 and transmitting the rotational speed to the steering shaft 92. The steering shaft 92 is a drive target of the EPS 8.

Figure 2:
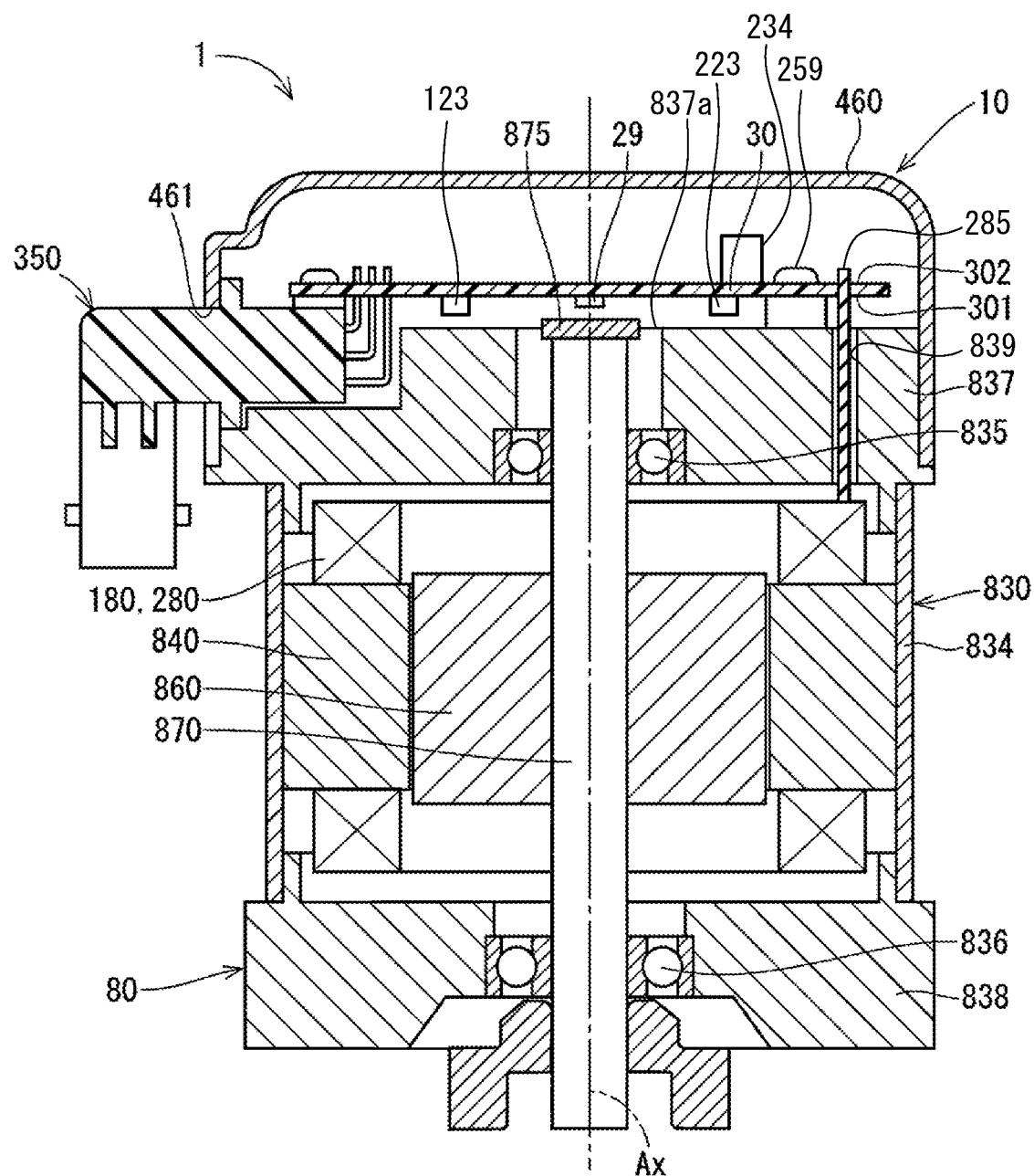
FIG. 2 is a cross-sectional view of a drive device applied to the steering system shown in FIG. 1.
Figure 3:
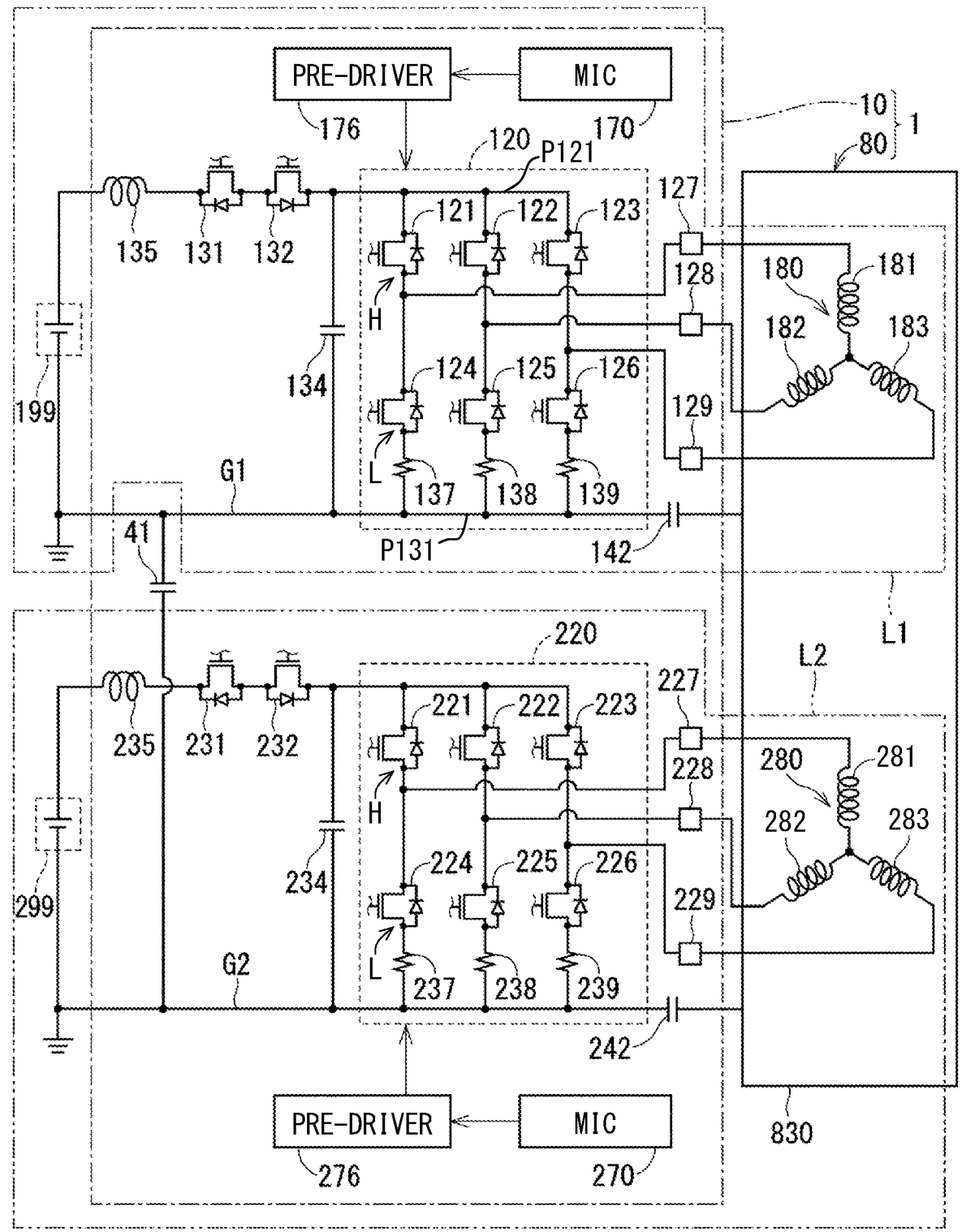
FIG. 3 is a circuit diagram of the drive device shown in FIG. 2.

As shown in FIGS. 2 and 3, the motor 80 is a three-phase brushless motor. The motor 80 outputs part or all of a torque required for steering, and is driven by a power supplied from batteries 199 and 299 to rotate the reduction gear 89 forward and backward.

The motor 80 has a first winding 180 and a second winding 280 as a winding set. The windings 180 and 280 have equivalent electrical characteristics and are cancel-wound on a common stator 840 with electrical angles shifted by 30 [deg] from each other. In response to the above configuration, the windings 180 and 280 are controlled to be energized with a phase current whose phase φ is shifted by 30 [deg].

A combination of configurations relating to an energization control of the first winding 180 is referred to as a first system circuit L1, and a combination of configurations relating to an energization control of the second winding 280 is referred to as a second system circuit L2. The configuration of the first system circuit L1 is mainly numbered in the 100's. The configuration of the second system circuit L2 is mainly numbered in the 200's. The configurations substantially similar to each other in the system circuits L1 and L2 are numbered so that the last two digits are the same, and a description of those configurations will be omitted as appropriate.

As shown in FIG. 2, the drive device 1 has the ECU 10 integrally provided on one side of the motor 80 in an axial direction, which is so-called "electromechanical integrated type" (also may be referred to as a machine/electricity integral type device). The ECU 10 is provided on the other side of the reduction gear 89 with respect to the motor 80. The ECU 10 is disposed coaxially with a center line Ax of a rotation shaft 870. With the electromechanical integrated type, the ECU 10 and the motor 80 can be efficiently placed in a vehicle having a limited mounting space. Hereinafter, when simply referred to as "axial direction" or "radial direction", these directions mean the axial direction or the radial direction of the motor 80.

The motor 80 includes a stator 840, a rotor 860, a rotation shaft 870, and a housing 830 that accommodates the stator 840, the rotor 860, the rotation shaft 870, and the like. The stator 840 is fixed to the housing 830, and the windings 180 and 280 are wound around the stator 840. The rotor 860 is provided radially inward of the stator 840 and rotatable relative to the stator 840.

The rotation shaft 870 is fitted into the rotor 860 and rotates integrally with the rotor 860. The rotation shaft 870 is rotatably supported by the housing 830 by the aid of bearings 835 and 836. An end of the rotation shaft 870 on the ECU 10 side protrudes from the housing 830 toward the ECU 10 side. A magnet 875 as a detection target is provided at the end of the rotation shaft 870 on the ECU 10 side.

The housing 830 has a cylindrical case 834, a rear frame end 837 provided at one end of the case 834, and a front frame end 838 provided at the other end of the case 834.

An opening 837a through which the rotation shaft 870 is inserted and disposed is provided in the rear frame end 837. A lead wire insertion hole 839 is provided in the rear frame end 837. A lead wire 285 connected to each phase of the windings 180 and 280 is inserted into the lead wire insertion hole 839. The lead wire 285 is taken out from the lead wire insertion hole 839 to the ECU 10. The lead wire 285 is inserted through motor wire connection portions 186 and 286 (see FIGS. 4 and 5) and connected to a substrate 30 by solder or the like.

The ECU 10 includes the substrate 30 and various electronic components mounted on the substrate 30. The substrate 30 is fixed to a surface of the rear frame end 837 opposite to the motor 80 by bolts 259 (see FIG. 2) inserted through substrate connection portions 155 and 255. The bolts 259 are made of a conductive material. A surface of the substrate 30 on the motor 80 side is defined as a motor surface 301, and the surface of the substrate 30 on the opposite side to the motor 80 is defined as a cover surface 302. The cover 460 is formed in a substantially bottomed cylindrical shape and fits radially outward of the rear frame end 837. The cover 460 is provided so as to cover the substrate 30, and protects the ECU 10 from an external impact, and prevents entry of dust, water, or the like into the ECU 10. An opening 461 is provided on a side surface of the cover 460.

The connector 350 has connector terminals such as a first power supply terminal, a first ground terminal, a first signal terminal, a second power supply terminal, a second ground terminal, and a second signal terminal. Each of the first power supply terminal, the first ground terminal, and the first signal terminal is inserted from the motor surface 301 side of the substrate 30, and electrically connected to a first power supply terminal connection portion 151, a first ground terminal connection portion 152, and a first signal terminal connection portion 153 (see FIGS. 4 and 5). Each of the second power supply terminal, the second ground terminal, and the second signal terminal is inserted from the motor surface 301 side of the substrate 30, and electrically connected to the second power supply terminal connection portion 251, the second ground terminal connection portion 252, and the second signal terminal connection portion 253 (see FIGS. 4 and 5).

FIG. 3 shows a circuit configuration of the drive device 1. The ECU 10 includes a first inverter 120, first motor relays 127 to 129, first power supply relays 131 and 132, a first capacitor 134, and a first coil 135, which are provided corresponding to the first winding 180. The ECU 10 further includes second inverter 220, second motor relays 227 to 229, second power supply relays 231 and 232, a second capacitor 234, and a second coil 235, which are provided corresponding to the second winding 280.

The first inverter 120 and the like of the first system circuit L1 are supplied with an electric power from the first battery 199. The second inverter 220 and the like of the second system circuit L2 are supplied with an electric power from the second battery 299. In the present embodiment, the ground is also separated by the first system circuit L1 and the second system circuit L2. The first microcomputer 170 controls the energization of the first winding 180, and the second microcomputer 270 controls the energization of the second winding 280.

In other words, in the present embodiment, the first system circuit L1 and the second system circuit L2 are provided independently of each other in a completely redundant configuration. The ECU 10 made redundant as described above corresponds to a "redundant circuit device". The redundant circuit device includes a power conversion circuit for converting a supplied power to output the converted power to the motor 80, and a control circuit for controlling the operation of the power conversion circuit.

The first inverter 120 is a three-phase inverter, and the first switching elements 121 to 126 are connected in a bridge manner. The switching elements 121 to 123 are connected to a high potential side to form an upper arm H. The switching elements 124 to 126 are connected to a low potential side to form a lower arm L. A connection point of the paired U-phase switching elements 121 and 124 is connected to one end of a first U-phase coil 181. A connection point of the paired V-phase switching elements 122 and 125 is connected to one end of a first V-phase coil 182. A connection point of the paired W-phase switching elements 123 and 126 is connected to one end of a first W-phase coil 183. The other ends of the coils 181 to 183 are connected to each other. Shunt resistors 137 to 139, which are current detection elements for detecting currents flowing in the coils 181 to 183, are provided on the low potential side of the switching elements 124 to 126, respectively. The high potential side may be referred to as a high electric potential side, and a low potential side may be referred to as a low electric potential side.

The second inverter 220 has the same configuration as that of the first inverter 120. In other words, the switching elements 221 to 223 are connected to a high potential side to form an upper arm H. The switching elements 224 to 226 are connected to a low potential side to form a lower arm L. Output points of the upper and lower arm circuits of the respective UVW-phases are connected to the respective UVW-phase coils. Shunt resistors 237 to 239, which are current detection elements for detecting currents flowing in the coils 281 to 283, are provided on the low potential side of the switching elements 224 to 226.

Those shunt resistors 137 to 139 and 237 to 239 correspond to a "current detection circuit" for detecting a current flowing through an arm of each phase. A current value detected by the current detection circuit is input to the microcomputers 170 and 270. The microcomputers 170 and 270 correspond to a "control circuit" that controls the operation of the inverters 120 and 220 based on the current value detected by the current detection circuit.

The first motor relays 127 to 129 are provided between the first inverter 120 and the first winding 180, and are provided so that the first inverter 120 and the first winding 180 can be disconnected from each other and connected to each other. The U-phase motor relay 127 is provided between the connection point of the switching elements 121 and 124 and the U-phase coil 181. The V-phase motor relay 128 is provided between the connection point of the switching elements 122 and 125 and the V-phase coil 182. The W-phase motor relay 129 is provided between the connection point of the switching elements 123 and 126 and the W-phase coil 183. The second motor relays 227 to 229 have the same configuration as that of the first motor relays 127 to 129, and are provided for the respective UVW-phases.

The first power supply relays 131 and 132 are connected in series with each other so that orientations of parasitic diodes are opposite to each other, and are provided between the first battery 199 and the first inverter 120. The second power supply relays 231 and 232 are connected in series with each other so that orientations of parasitic diodes are opposite to each other, and are provided between the second battery 299 and the second inverter 220. This prevents a current from flowing in a reverse direction and protects the ECU 10 if the batteries 199 and 299 are incorrectly connected in the reverse direction.

The pre-driver 176 outputs a drive signal based on a control signal from the first microcomputer 170. The first switching elements 121 to 126, the first motor relays 127 to 129, and the first power supply relays 131 and 132 are controlled to be turned on and off according to the drive signal. The pre-driver 276 of the second system circuit L2 functions in the same manner as that of the pre-driver 176 of the first system circuit L1. In other words, the second switching elements 221 to 226, the second motor relays 227 to 229, and the second power supply relays 231 and 232 are on-off controlled by the pre-driver 276. In order to avoid complication of the drawings, control lines to the motor relays and the power supply relays are omitted in FIG. 3.

The first capacitor 134 is connected in parallel with the first inverter 120, and the second capacitor 234 is connected in parallel with the second inverter 220. The capacitors 134 and 234 are formed of, for example, aluminum electrolytic capacitors. The first coil 135 is provided between the first battery 199 and the first power supply relay 131, and the second coil 235 is provided between the second battery 299 and the second power supply relay 231.

The first capacitor 134 and the first coil 135, and the second capacitor 234 and the second coil 235 each form a filter circuit. Those filter circuits reduce noise transmitted from other devices sharing the batteries 199 and 299. In addition, the filter circuits reduce the noise transmitted from the drive device 1 to the other devices sharing the batteries 199 and 299. In addition, the capacitors 134 and 234 store electric charges, thereby assisting a power supply to the inverters 120 and 220.

An inter-system ground connection capacitor 41 connects a first system ground G1 and a second system ground G2. A first electromechanical connection capacitor 142 connects the first system ground G1 and the housing 830 of the motor 80. A second electromechanical connection capacitor 242 connects the second system ground G2 and the housing 830. The capacitors 41, 142, and 242 are formed of, for example, ceramic capacitors.

Figure 4:
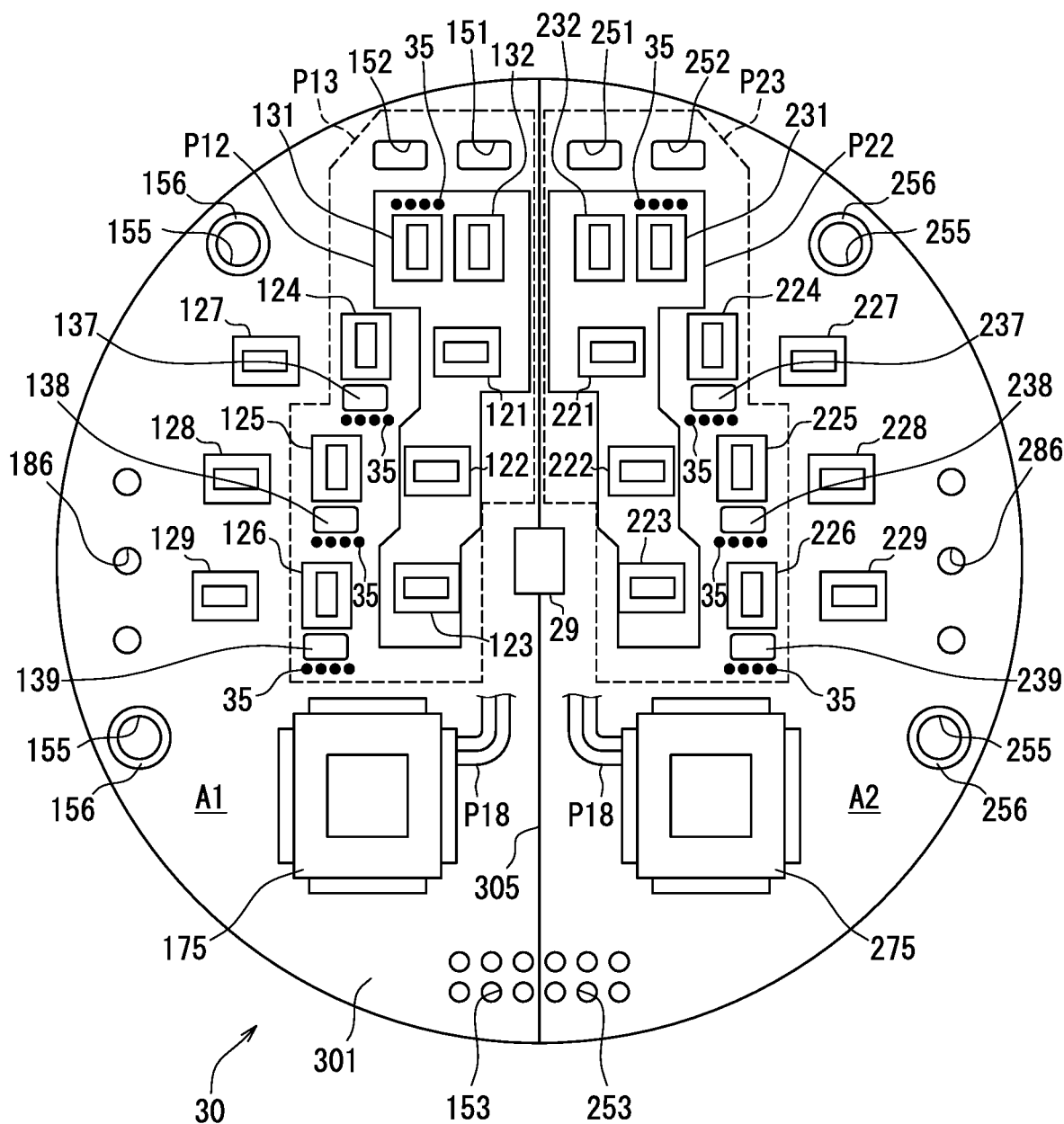
FIG. 4 is a bottom view of an inverter applied to the drive device shown in FIG. 2, when viewed from a side of a motor.
Figure 5:
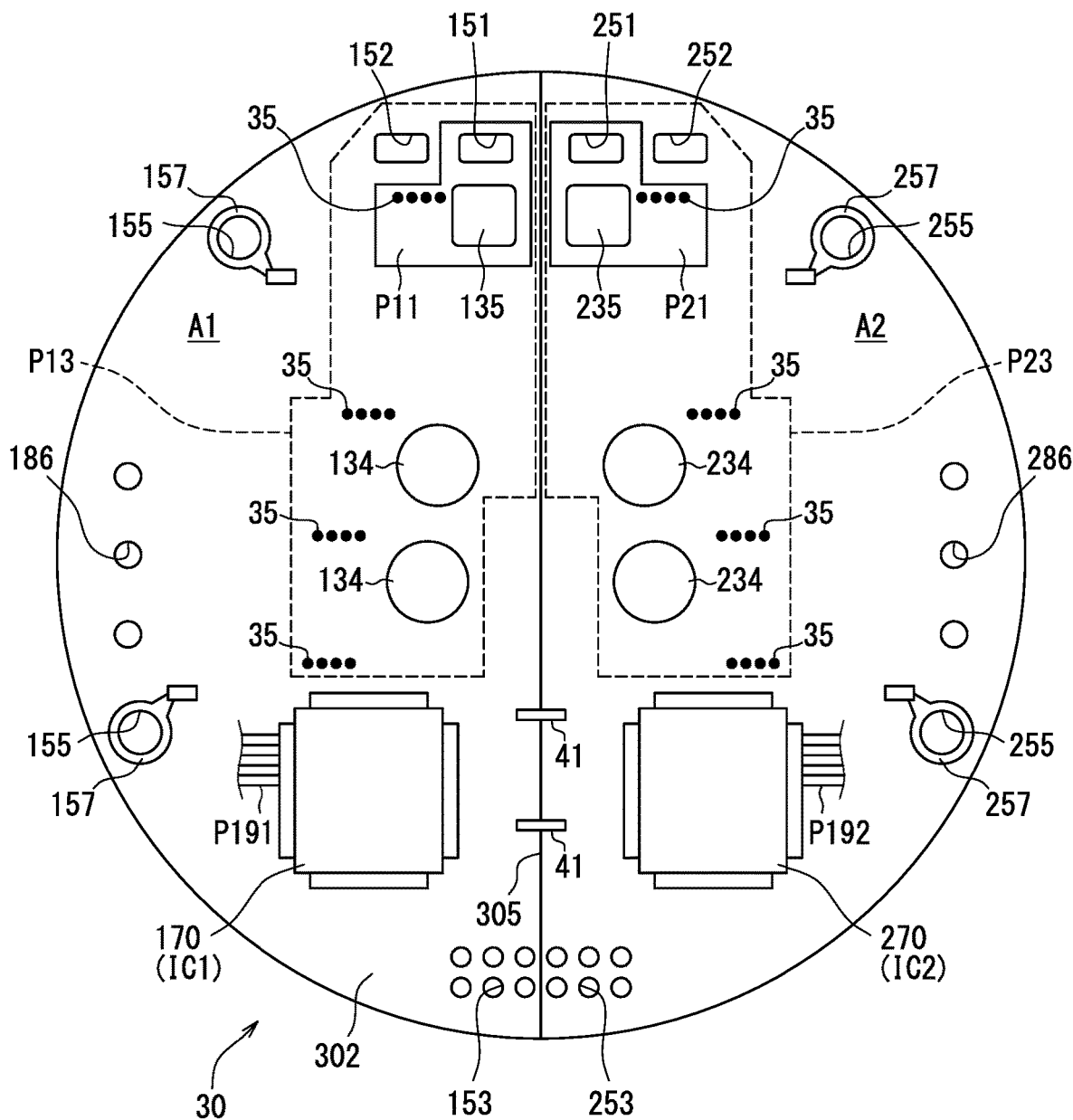
FIG. 5 is a top view of the inverter applied to the drive device shown in FIG. 2, when viewed from an opposite side of the motor.

The motor surface 301 of the substrate 30 is shown in FIG. 4, and the cover surface 302 is shown in FIG. 5. For the sake of description, the placement of the cover surface 302 is reversed, and the first system circuit L1 is shown on a left side and the second system circuit L2 is shown on a right side of a plane of paper.

As shown in FIG. 4, the switching elements 121 to 126 and 221 to 226 and the shunt resistors 137 to 139 and 237 to 239 are mounted on the motor surface 301 of the substrate 30. The motor relays 127 to 129 and 227 to 229, and the power supply relays 131, 132, 231, and 232 are mounted on the motor surface 301. Further, integrated ICs 175 and 275 and a rotation angle sensor 29 (sensor element) are mounted on the motor surface 301. The integrated IC 175 includes the pre-driver 176, and the integrated IC 275 includes the pre-driver 276. The rotation angle sensor 29 detects a change in a magnetic field by the magnet 875 provided on the rotation shaft 870, and outputs a detection signal corresponding to a rotation angle of the rotation shaft 870.

As shown in FIG. 5, the capacitors 134 and 234 and the coils 135 and 235 are mounted on the cover surface 302 of the substrate 30. Further, the inter-system ground connection capacitor 41, the electromechanical connection capacitors 142 and 242 (see FIG. 3), and the microcomputers 170 and 270 are mounted on the cover surface 302.

As shown in FIGS. 4 and 5, the substrate 30 is electrically separated into two pieces by a slit 305. One region is referred to as a first region A1, and the other region is referred to as a second region A2. Components related to the first system circuit L1 are mounted on the motor surface 301 and the cover surface 302 of the first region A1. Components related to the second system circuit L2 are mounted on the motor surface 301 and the cover surface 302 of the second region A2. The slit 305 is a boundary line defining both the regions, and the boundary line is a straight line passing through the center of the substrate 30. The first region A1 and the second region A2 are separated so as to have the same area.

The rotation angle sensor 29 is located on the boundary line between the first region A1 and the second region A2. The rotation angle sensor 29 is disposed in a region of the substrate 30 facing the opening 837a of the rear frame end 837 (opening facing region). The rotation angle sensor 29 is mounted across the slit 305 on the motor surface 301. The inter-system ground connection capacitor 41 is mounted across the slit 305 on the cover surface 302, and connects the first system ground G1 and the second system ground G2.

The first electromechanical connection capacitor 142 connects a ground pattern P13 of the first system circuit L1 (see FIG. 5) and a housing connection pattern 157. The second electromechanical connection capacitor 242 connects a ground pattern P23 of the second system circuit L2 (see FIG. 5) and a housing connection pattern 257. The housing 830 is connected to the vehicle ground. In other words, the capacitors 41, 142, and 242 are all capacitors for connecting between the grounds. Further, it may be conceived that the inter-system ground connection capacitor 41 connects between the grounds of the power system circuits of the system circuits L1 and L2.

In the present embodiment, the drive device 1 is applied to the EPS 8, and a large current is supplied in a short time, so that switching noise and ringing noise may be generated. The noise N described above is generated mainly in a circuit of the ECU 10, and the generated noise may propagate to the vehicle side through the connector 350 and the motor 80. Therefore, the ground of the substrate 30 and the housing 830 are electrically connected to each other by use of bolts to form a noise feedback path from the motor 80 toward the ECU 10. As a result, the noise generated in the circuit of the ECU 10 is fed back to a noise source, and the noise is inhibited from propagating to the vehicle side.

Figure 6:
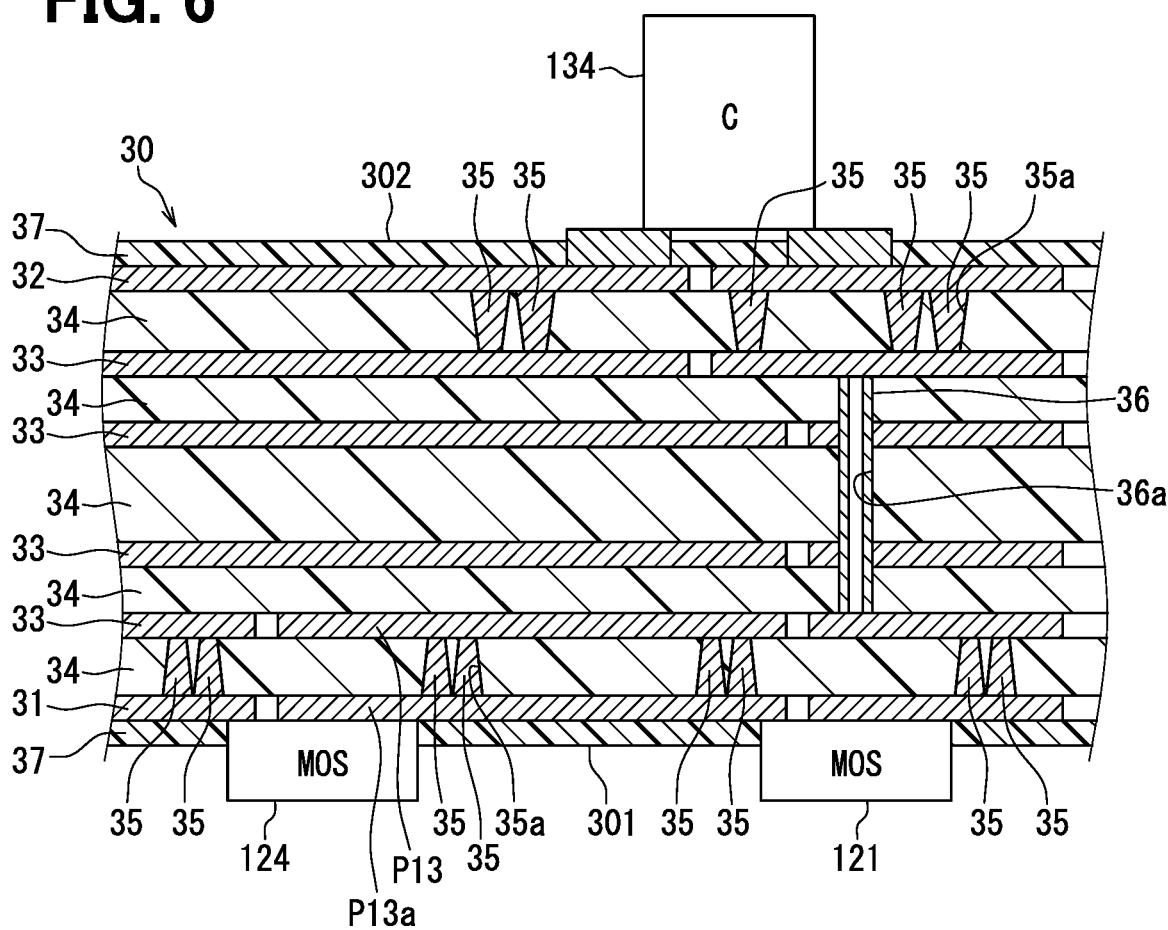
FIG. 6 is a cross-sectional view of the inverter according to the first embodiment.

As shown in FIG. 6, a multilayer substrate is used as the substrate 30 according to the present embodiment. Multiple wiring layers, multiple insulating layers 34, surface resist layers 37, vias, and the like are formed in the substrate 30. Conductive wirings are provided in the wiring layers. The insulating layer 34 having an electrical insulation property is disposed between the adjacent wiring layers.

The wiring layers include surface layers 31 and 32 and inner layers 33. The surface layers 31 and 32 are outermost layers of all the wiring layers. The inner layers 33 are layers located inside the entire wiring layers. In an example of FIG. 6, the inner layers 33 include four layers (multiple layers). The surface layers 31 and 32 are covered with surface resist layers 37. The surface resist layer 37 covering the surface layer 31 forms the motor surface 301. The surface resist layer 37 covering the surface layer 32 forms the cover surface 302.

The vias include through-hole vias (not illustrated) and inner vias 35a and 36a. The through-hole vias are shaped to penetrate through all of the surface layers 31, 32 and the inner layers 33 (all wiring layer). The inner vias 35a are shaped to extend across one of the surface layers 31 and 32 and one inner layer 33 adjacent to the one surface layer. The inner via 36a is shaped to extend across all the inner layers 33 except for the surface layers 31 and 32. The inner vias 35a are provided by laser machining, and the inner via 36a is provided by drilling.

Inner surfaces of the through-hole vias and the inner via 36a are subjected to plating 36 as conductive members. The plating 36 is cylindrically shaped to provide a space inside. A non-conductive member (not shown) is packed inside the cylinder of the inner via 36a. On the other hand, a conductive member is buried in each of the inner vias 35a. The conductive member has a solid shape, and is referred to as a solid via 35 in the following description. The solid vias 35 and the plating 36 electrically connect wiring patterns formed in arbitrary wiring layers. Specific examples of a material of the plating 36 and the solid vias 35 include copper.

A part of the wiring pattern formed in the wiring layer functions as a wiring for connecting the electronic components shown in FIG. 3. The wiring patterns include the ground patterns P13 and P23 and the power supply patterns P11, P12, P21, and P22.

(Details of Ground Pattern)

The ground patterns P13 and P23 provide a part of the grounds G1 and G2, and are electrically connected to the ground terminal connection portions 152 and 252 described above. The ground patterns P13 and P23 are electrically connected to the electromechanical connection capacitors 142 and 242 and the inter-system ground connection capacitor 41 in the surface layer 32 on the cover surface 302 side. The respective ground patterns P13 and P23 are electrically connected to low-potential side terminals of the capacitors 134 and 234 and the shunt resistors 137 to 139 and 237 to 239 in the surface layer 31 on the motor surface 301 side.

The ground patterns P13 and P23 shown in FIG. 4 and FIG. 5 are parts of the ground patterns provided in all the wiring layers, and the other ground patterns are omitted in the drawing. The ground patterns P13 and P23 are provided on the inner layer 33.

The ground patterns of the same system circuits provided in different wiring layers are connected to each other by multiple solid vias 35 and the plating 36. For example, in FIG. 6, the ground pattern P13 of the inner layer 33 and the ground pattern P13 provided on the surface layer 31 are connected to each other by the multiple solid vias 35 and the plating 36. For example, in FIGS. 4 and 5, the ground pattern of the surface layer 31 (not shown) connected to the low-potential side terminals of the shunt resistors 137 to 239 and the ground patterns P13 and P23 of the inner layer 33 are connected to each other by the multiple solid vias 35.

The ground pattern P13 of the first system circuit L1 is shaped to include the whole of the power supply relays 131 and 132, the switching elements 121 to 126, and the shunt resistors 137 to 139 when viewed from the direction perpendicular to the plate surface of the substrate 30 (plate surface perpendicular direction). Similarly, the ground pattern P23 of the second system circuit L2 is shaped to include the whole of the power supply relays 231 and 232, the switching elements 221 to 226, and the shunt resistors 237 to 239 when viewed from the plate surface perpendicular direction. In other words, all of the components such as the power supply relays 231 and 232, the switching elements 221 to 226, and the shunt resistors 237 to 239 are overlapped with the ground patterns P13 and P23 when viewed from the plate surface perpendicular direction.

The coils 135 and 235 and the capacitors 134 and 234 provided on the cover surface 302 are also entirely overlapped with the ground patterns P13 and P23 when viewed from the plate surface perpendicular direction. The component group overlapped with the ground patterns P13 and P23 among the components provided on the surface layers 31 and 32 is referred to as ground pattern overlapped components. The solid vias 35 connected to the ground pattern overlapped component are also overlapped with the ground patterns P13 and P23. For example, as shown in FIGS. 4 and 5, the solid vias 35 connected to the shunt resistors 237 to 239 and the solid vias 35 connected to the power supply relay 131 are also entirely overlapped with the ground patterns P13 and P23 when viewed from the plate surface perpendicular direction.

(Details of Power Supply Pattern)

The power supply patterns P11 to P22 are connected to the high potential side of the inverters 120 and 220 to supply an electric power. The power supply patterns P11 to P22 of the respective system circuits are electrically connected to the high-potential side terminals of the capacitors 134 and 234 and the power supply relays 132 and 232 in the surface layer 31 on the motor surface 301 side. The power supply patterns P11 to P22 of the respective system circuits are electrically connected to the high-potential side terminals of the switching elements 121 to 123 and 221 to 223.

The power supply patterns P11 to P22 shown in FIGS. 4 and 5 are a part of the power supply patterns provided in each of all the wiring layers, and other power supply patterns are omitted in the drawing. The illustrated power supply patterns P11 and P21 are provided on the surface layer 32 on the cover surface 302 side. The illustrated power supply patterns P12 and P22 are provided on the surface layer 31 on the motor surface 301 side.

The power supply patterns of the same system circuits provided in different wiring layers are connected to each other by the multiple solid vias 35 and the plating 36. For example, in FIGS. 4 and 5, the power supply patterns P12 and P22 of the surface layer 31 to which the first power supply relays 131 and 231 are connected and the power supply patterns P11 and P21 of the surface layer 32 are connected to each other by the multiple solid vias 35 and the plating 36.

The power supply pattern P11 of the first system circuit L1 provided on the surface layer 32 is shaped to include the whole of the power supply terminal connection portion 151 and the coil 135 when viewed from the plate surface perpendicular direction. The power supply pattern P21 of the second system circuit L2 provided on the surface layer 32 is similarly shaped to include the whole of the power supply terminal connection portion 251 and the coil 235 when viewed from the plate surface perpendicular direction. In other words, the whole of the power supply terminal connection portions 151 and 251 and the coils 135 and 235 are overlapped with the power supply patterns P11 and P21 when viewed from the plate surface perpendicular direction.

The power supply pattern P12 of the first system circuit L1 provided on the surface layer 31 is shaped to include the whole of the switching elements 121 to 123 and the power supply relays 131 and 132 when viewed from the plate surface perpendicular direction. In the same manner, the power supply pattern P22 of the second system circuit L2 provided on the surface layer 31 is shaped to include the whole of the switching elements 221 to 223 and the power supply relays 231 and 232 when viewed from the plate surface perpendicular direction. In other words, the switching elements 121 to 223 and the power supply relays 131 to 232 are entirely overlapped with the power supply patterns P12 and P22 when viewed from the plate surface perpendicular direction.

Among the components provided on the surface layer 31, the component group overlapped with the power supply patterns P12 and P22 is referred to as power supply pattern overlapped components. The solid vias 35 connected to the power supply pattern overlapped components are also overlapped with the power supply patterns P12 and P22. For example, as shown in FIGS. 4 and 5, the solid vias 35 connected to the power supply relays 131 and 231 are also overlapped with the power supply patterns P11 to P22 when viewed from the plate surface perpendicular direction.

The ground pattern P13 of the first system circuit L1 is shaped to include the whole of the power supply patterns P11 and P12 of the first system circuit L1 when viewed from the plate surface perpendicular direction. In the same manner, the ground pattern P23 of the second system circuit L2 is shaped to include the whole of the power supply patterns P21 and P22 of the second system circuit L2 when viewed from the plate surface perpendicular direction. In other words, the whole of the power supply patterns P11 to P22 is overlapped with the ground patterns P13 and P23 when viewed from the plate surface perpendicular direction.

Among the multiple wiring layers, when the surface layer 31 on the motor surface 301 side is defined as a "first layer" and the inner layer 33 located adjacent to the first layer is defined as a "second layer", an area of each pattern has the following magnitude relationship. In the first system circuit L1, an area of the second layer ground pattern portion, which is the ground pattern P13 provided in the second layer, is larger than an area of the first layer power supply pattern portion, which is the power supply pattern P12 provided in the first layer.

When the surface layer 32 on the cover surface 302 side is defined as the "first layer", the area of the second layer ground pattern portion, which is the ground pattern P13 provided in the second layer, is larger than the area of the first layer power supply pattern portion, which is the power supply pattern P11 provided in the first layer.

The rotation angle sensor 29 is disposed in a region of the substrate 30 facing the opening 837a through which the rotation shaft 870 is inserted and disposed (opening facing region). The power supply pattern and the ground pattern are disposed at positions not overlapping with the rotation angle sensor 29 when viewed from the plate surface perpendicular direction.

(Details of Surface Mount Component SMD)

In the following description, the power supply relays, the switching elements, the motor relays, the integrated ICs, and the microcomputers are collectively referred to as surface mount components SMD. In addition, components included in the first system circuit L1 in the surface mount components SMD are referred to as first mount components, and components included in the second system circuit L2 are referred to as second mount components. Also, among the first mount components included in the first system circuit L1, the switching elements included in the power conversion circuit are collectively referred to as a first MOS1. Among the second mount components included in the second system circuit L2, the switching elements included in the power conversion circuit are collectively referred to as a second MOS2. The integrated circuit components included in the control circuit among the first mount components included in the first system circuit L1 are collectively referred to as a first IC1. Among the second mount components included in the second system circuit L2, the integrated circuit components included in the control circuit are collectively referred to as a second IC2.

Those surface mount components SMD have a rectangular shape when viewed from the plate surface perpendicular direction. As described above, the boundary line dividing the first region A1 and the second region A2 of the substrate 30 is a straight line. The surface mount component SMD is mounted in a direction in which one side of the rectangle is parallel to the boundary line.

Figure 7:
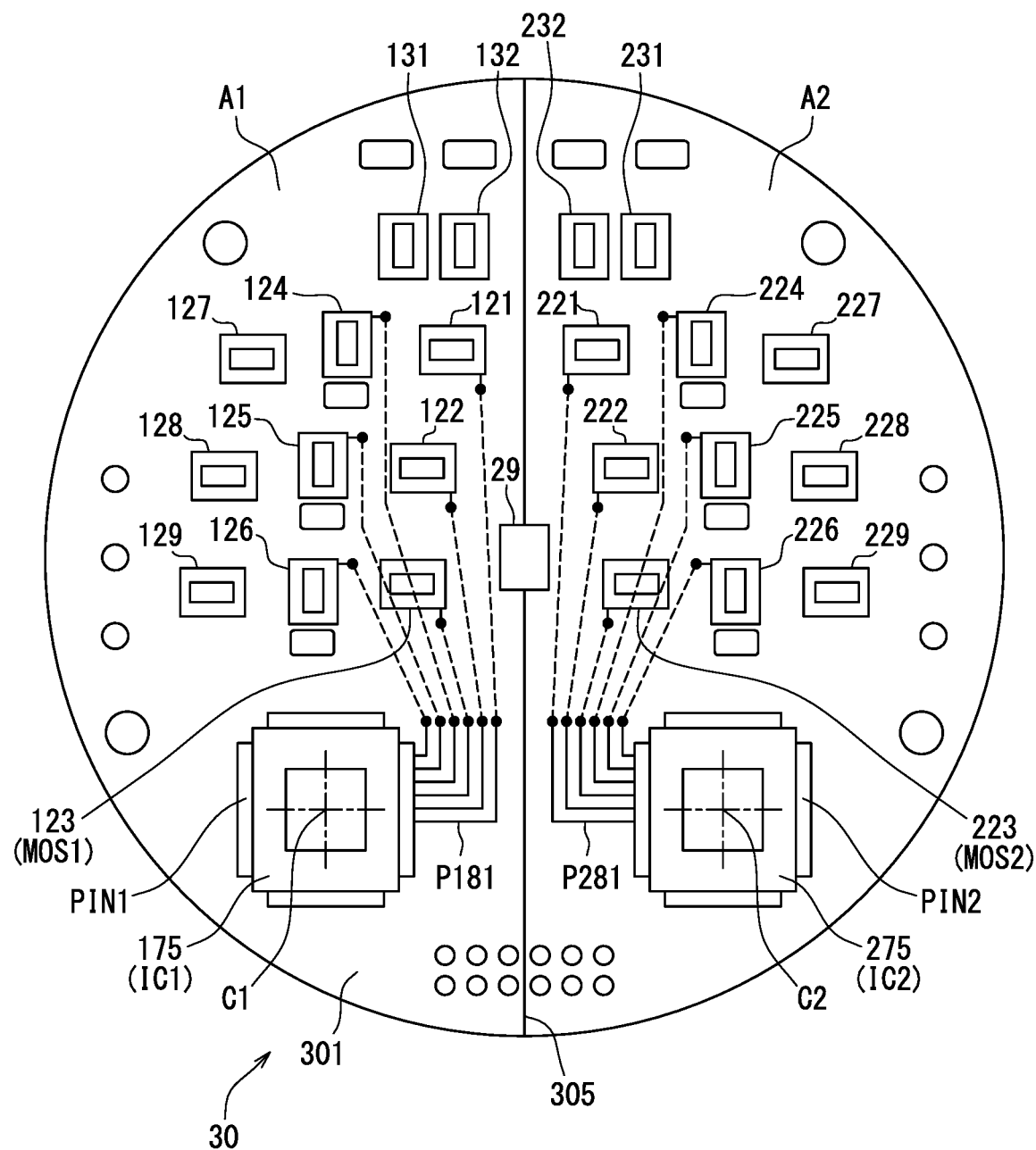
FIG. 7 is a diagram schematically showing a pattern of a printed wiring according to the first embodiment.
Figure 8:
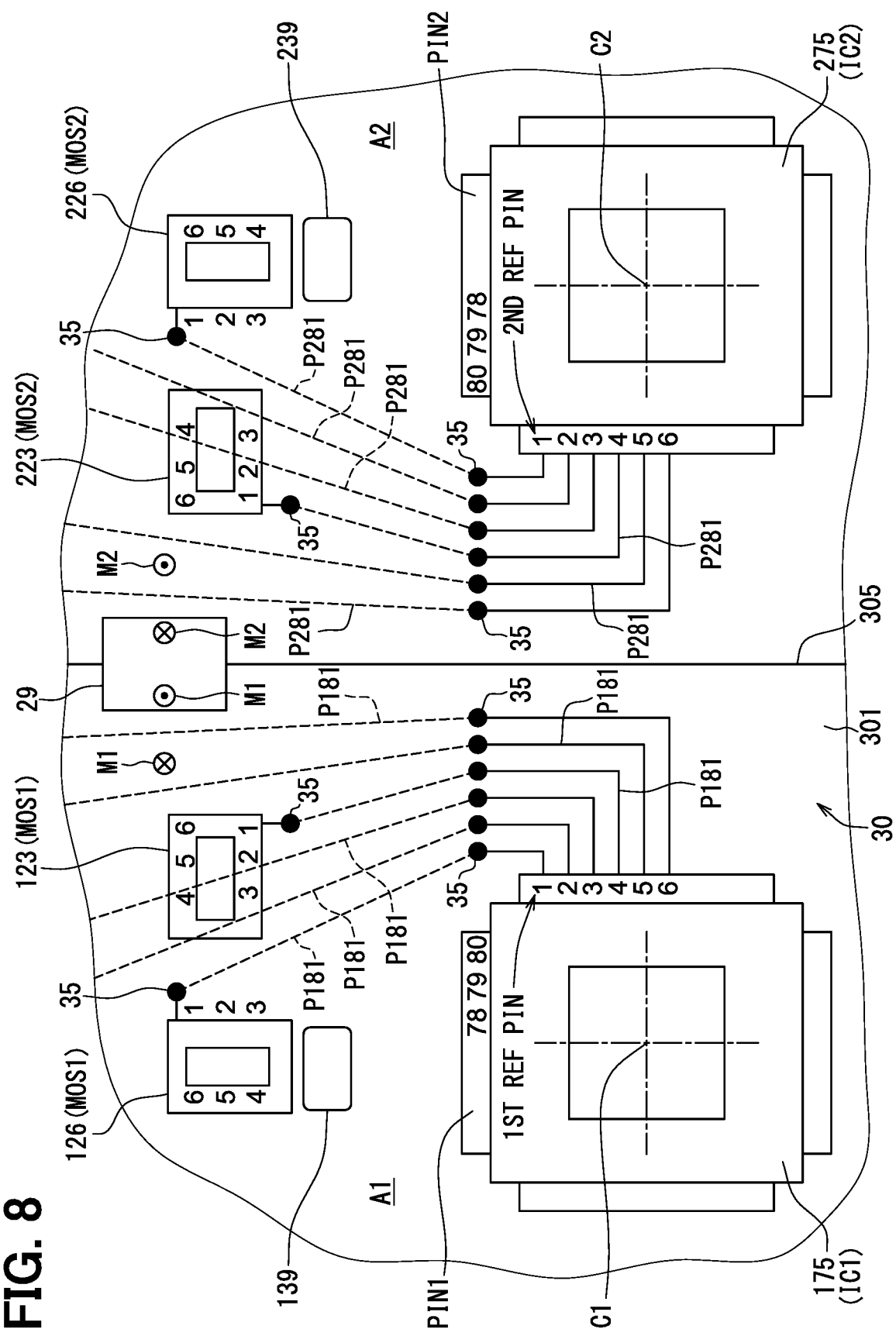
FIG. 8 is an enlarged view of FIG. 7.

As shown in FIG. 7 and FIG. 8, a center point C2 of the second IC2 is located at a position where a center point C1 of the first IC1 is inverted with respect to the boundary line as a symmetry axis when viewed from the plate surface perpendicular direction. In short, the first IC1 and second IC2 are disposed so as to have a positional relationship inverted with respect to the boundary line as a symmetry axis. In the same manner, the first MOS1 and the second MOS2 are disposed so as to have a positional relationship inverted with respect to the boundary line as symmetry axes.

The surface mount component SMD has three or more terminals (pins). For example, the first MOS1 and the second MOS2 each has a gate terminal, a source terminal, a drain terminal, and an output terminal such as a temperature sensor incorporated in the MOS.

For example, as shown in FIG. 7, the first IC1 has multiple terminals (first pins PIN1), and second IC2 has multiple terminals (second pins PIN2). The first pins PIN1 and the second pins PIN2 include multiple sensor signal terminal groups input from various sensors such as the rotation angle sensor 29. The first pins PIN1 and the second pins PIN2 include multiple voltage monitor terminal groups that receive detection signals for monitoring voltages at respective portions. The first pins PIN1 and the second pins PIN2 include multiple input terminal groups that receive calculation values calculated by other microcomputers. The first pins PIN1 and the second pins PIN2 include multiple output terminal groups that output calculation values calculated by those first and second pins PIN1 and PIN2.

In an example of FIG. 8, a positional relationship (also referred to as a first pin placement) of the multiple first pins PIN1 and a positional relationship (also referred to as a second pin placement) of the multiple second pins PIN1 are mirror-inverted. The "pin placement" will be described. The term placement may also be referred to as "arrangement".

Numbers assigned to the first pins PIN1 and the second pins PIN2 in FIG. 8 indicate serial numbers assigned to each of the pins for each function, and are sequentially assigned in a clockwise direction or a counterclockwise direction when viewed from the plate surface perpendicular direction. In an example of the IC shown in FIG. 8, serial numbers from "1" to "80" are assigned to 80 pins. In an example of the MOS shown in FIG. 8, serial numbers from "1" to "6" are assigned to six pins.

The placement of the multiple first pins PIN1 with respect to a center point C1 of the first IC1 is referred to as a first pin placement. The placement of the multiple second pins PIN2 with respect to the center point C2 of the second IC2 is referred to as a second pin placement. The first pin placement is a placement in which pin numbers are sequentially assigned in a clockwise direction when viewed from the motor surface 301 side. The second pin placement is a placement in which pin numbers are sequentially assigned in a counterclockwise direction when viewed from the motor surface 301 side. In other words, the second pin placement is a placement in which the first pin placement is mirror-inverted.

Figure 9:
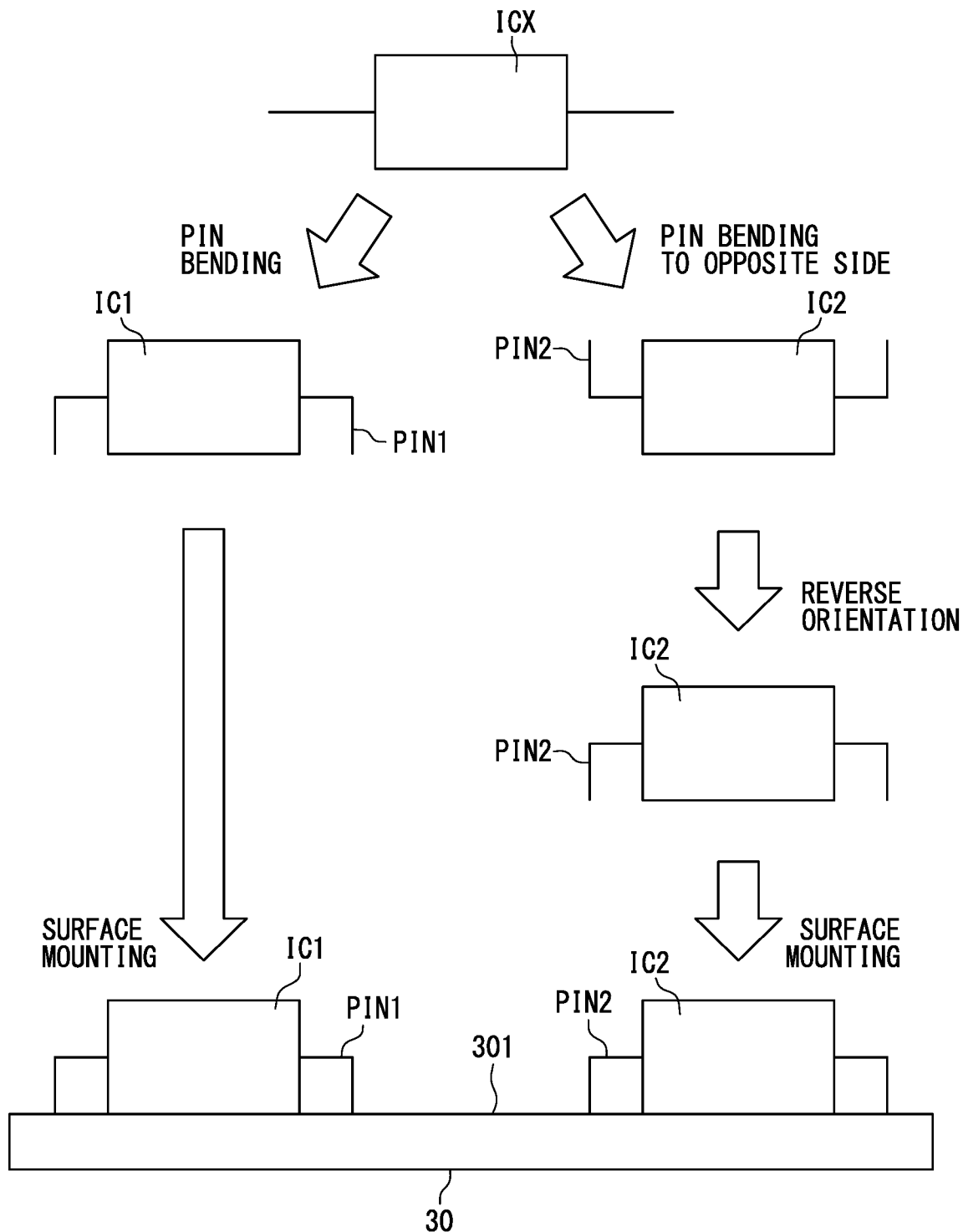
FIG. 9 is a diagram illustrating a difference in a manufacturing procedure between a first mount component and a second mount component.

FIG. 9 is a schematic view showing an example of a method of manufacturing the pin placement in which the mirror is inverted. First, two components ICx of the same surface mount components SMD in a state before the pins are bent are prepared. Next, the pins of a prepared first component ICx are bent to produce a first IC1.

The pins of a prepared second component ICx are bent in an opposite direction to that of the first mount component, thereby manufacturing a second IC2. Thereafter, the direction of the second IC2 is reversed up and down. As a result, the first pin placement and the second pin placement have a mirror-inverted placement relationship. Thereafter, the first IC1 and second IC2 manufactured as described above are surface-mounted on the substrate 30.

The other surface mount components SMD such as the first MOS1 and the second MOS2 are also manufactured in the same procedures as in FIG. 9. In other words, the bending direction of the pins are reversed so that the surface mount component SMD having the placement relationship in which the first pin placement and the second pin placement are mirror-inverted is manufactured.

In an example of FIG. 8, the second mounting direction in which the second IC2 is mounted on the substrate 30 coincides with the first mounting direction in which the first IC1 is mounted on the substrate 30. Hereinafter, the "mounting direction" will be described.

A pin having a predetermined function among first reference pins 1 is defined as a first reference pin. A pin having a predetermined function among second reference pins 2 is defined as a second reference pin. In the example of FIG. 8, pins assigned a number "1" corresponds to the first reference pin and the second reference pin. The predetermined function is, for example, the function of the voltage monitor terminal described above.

The position of the first reference pin around the center point C1 of the first IC1 in a direction with respect to the substrate 30 of the first IC1 mounted on the substrate 30 corresponds to the first mounting direction. The position of the second reference pin around the center point C2 of the second IC2 in the direction with respect to the substrate 30 of the second IC2 mounted on the substrate 30 corresponds to the second mounting direction.

Incidentally, the other surface mount components SMD such as the first MOS1 and the second MOS2 are the same as the pin placement and the mounting direction of the first IC1 and the second IC2. In other words, the first pin placement and the second pin placement have a mirror-inverted relationship, and the first mounting direction and the second mounting direction coincide with each other.

The first mount component and the second mount component are placed so as to have a positional relationship inverted with respect to the boundary line as a symmetry axis. Further, in the first mount component and the second mount component, the first pin placement and the second pin placement are in a mirror-inverted relationship, and the first mounting direction and the second mounting direction coincide with each other.

(Details of Wiring Patterns)

As shown in FIGS. 4 and 5, both of the power wiring patterns P11 to P13, and P21 to P23 and the control wiring patterns P181, P182, P191, and P192 are provided on the printed wiring formed on the substrate 30. In the following description, the control wiring patterns P181 and P191 included in the first system circuit L1 among the control wiring patterns P181, P182, P191, and P192 are referred to as first patterns. The control wiring patterns P281 and P291 included in the second system circuit L2 are referred to as second patterns.

One ends of the first patterns are connected to each of the first pins PIN1 of the first IC1, and the other ends of the first patterns are connected to each of the first pins of the first MOS1. Similarly, one ends of the second patterns are connected to each of the second pins PIN2 of the second IC2, and the other ends of the second pattern are connected to each of the second pins of the second MOS2. The pattern indicated by solid lines in FIG. 8 is provided on the surface layer 31, and the pattern indicated by dotted lines is provided on the inner layer 33. The pattern of the surface layer 31 and the pattern of the inner layer 33 are connected to each other by the solid vias 35.

The first patterns and the second patterns may have shapes and sizes (widths) mirror-inverted as far as possible in the first region A1 and the second region A2.

The mirror inversion of the first patterns and the second patterns can facilitate making an impedance of the printed wiring identical between the first region A1 and the second region A2. In other words, an impedance variation in both those regions can be reduced. If the impedance variation can be reduced, the variation between the heat generation amount generated in the first patterns and the heat generation amount generated in the second patterns can be reduced. Therefore, the required heat radiation amount can be reduced in designing the heat radiation in accordance with a system having a large heat generation amount. This makes it possible to promote an optimum heat radiation design.

The mirror inversion of the first patterns and the second patterns can facilitate making the noise emitted from the printed wiring identical between the first region A1 and the second region A2. This makes it possible reduce the emission noise variation in both the regions. If the emission noise variation can be reduced, the variation between an emission noise level generated in the first patterns and an emission noise level generated in the second patterns can be reduced. Therefore, the noise level required can be reduced for countermeasures against noise in accordance with a system having a large noise level. For that reason, the optimum noise countermeasures can be promoted.

It may be preferable to mirror-invert the first patterns and the second patterns from the viewpoint of improving the detection accuracy of the rotation angle sensor 29.

For example, a magnetic flux M1 is generated by a current flowing in a pattern closest to the slit 305 (boundary line) among the control wiring patterns P181 (first patterns). The magnetic flux M1 is generated on the rotation angle sensor 29 in a direction from the back side to the front side in the drawing. On the other hand, a current flows in a pattern closest to the slit 305 (boundary line) among the control wiring patterns P281 (second patterns), to thereby generate a magnetic flux M2. The magnetic flux M2 is generated on the rotation angle sensor 29 in a direction from the front side toward the back side in the drawing.

Therefore, the magnetic flux M1 and the magnetic flux M2 are opposite to each other on the rotation angle sensor 29, and thus act so as to cancel each other out. This makes it possible to inhibit the magnetic fluxes M1 and M2 generated by the current flowing through the control wiring patterns P181 and P281 from deteriorating the detection accuracy of the rotation angle sensor 29.

The mutual cancellation of the magnetic fluxes between the whole of the multiple first patterns and the whole of the multiple second patterns can be promoted. Therefore, the emission noise emitted from the entire substrate 30 can be reduced.

As described above, according to the present embodiment, the pin placement (first pin placement) of the first IC1 used in the first system circuit L1 and the pin placement (second pin placement) of the second IC2 used in the second system circuit L2 are mirror-inverted. This makes it possible to easily design the control wiring patterns P181 and P191 (first patterns) of the first system circuit L1 and the control wiring patterns P281 and P291 (second patterns) of the second system circuit L2 so as to approach the mirror-inverted shapes and sizes.

Therefore, in the first region A1 and the second region A2, the variation in impedance of both the patterns can be inhibited, and the optimum heat radiation design can be promoted as described above. In addition, in the first region A1 and the second region A2, the emission noise variation of both the patterns can be inhibited, and the optimum noise countermeasure can be promoted as described above. Further, the magnetic flux M1 generated in the first region A1 and the magnetic flux M2 generated in the second region A2 can be promoted to cancel each other. Therefore, the emission noise emitted from the entire substrate 30 can be reduced.

Further, in the present embodiment, the direction (second mounting direction) of the second mount component on the substrate 30 coincides with the direction obtained by mirror-inverting the direction (first mounting direction) of the first mount component on the substrate 30. For that reason, as compared with the case where the second mounting direction is deviated from the first mounting direction, the first patterns and the second patterns can be promoted to approach the mirror inversion.

Further, in the present embodiment, the boundary line between the first region A1 and the second region A2 is a straight line. The center point C2 of the second mount component is located at a position where the center point C1 of the first mount component is inverted with respect to the boundary line as a symmetry axis when viewed from the plate surface perpendicular direction. In other words, the position of the second mount component on the substrate 30 coincides with the reversed position of the first mount component. For that reason, as compared with the case where the position of the second mount component is deviated from the inversion position of the first mount component, the first patterns and the second patterns can be promoted to approach mirror inversion.

Further, in the present embodiment, the rotation angle sensor 29 is mounted on one surface side of the substrate 30 and positioned on the boundary line between the first region A1 and the second region A2. For that reason, the magnetic flux M1 generated in the first region A1 and the magnetic flux M2 generated in the second region A2 can be promoted to cancel each other. This makes it possible to inhibit the influence of the magnetic flux applied to the rotation angle sensor 29 by both the patterns, and to inhibit the deterioration of the detection accuracy of the rotation angle sensor 29.

Further, in the present embodiment, the printed wiring formed on the substrate 30 includes both of the power wiring patterns P12, P13, P22, and P23 included in the power conversion circuit and the control wiring patterns P181, P182, P191, and P192 included in the control circuit.

When the first patterns and the second patterns are mirror-inverted with respect to the pattern connecting the power conversion circuit and the control circuit, compared to when both the patterns are mirror-inverted in the power conversion circuit and the control circuit, a placement restriction of the pattern is large. For that reason, when the surface mount component SMD having the mirror inversion pin placement is employed in the substrate 30 having both the patterns as in the present embodiment, the above-mentioned advantage that both the patterns can be easily mirror-inverted can be remarkably exhibited.

Further, in the present embodiment, each of the first mount component and the second mount component includes the first IC1 and the second IC2 (integrated circuit components). Each of the first mount component and the second mount component includes the first MOS1 and the second MOS2 (switching elements) included in the power conversion circuit.

The number of terminals of the integrated circuit components tends to be larger than that of the switching elements. For that reason, the employment of the integrated circuit component having the mirror inversion pin placement as in the present embodiment remarkably exhibits the above-mentioned advantage that both the patterns can be easily mirror-inverted. In addition, the switching element for electric power tends to have greater restrictions on the mounting position and the mounting direction as compared with the integrated circuit component. For that reason, the employment of the power switching element having the mirror inversion pin placement as in the present embodiment remarkably exhibits the above-mentioned advantage that both the patterns can be easily mirror-inverted.

Further, in the present embodiment, the power conversion circuit included in the redundant circuit device supplies an electric power to the motor 80 of the EPS 8 which exhibits a steering force of the vehicle. Since the motor 80 for the EPS 8 has a characteristic that a large current flows instantaneously, the emission noises are likely to occur. For that reason, the effect of inhibiting the emission noise according to the present embodiment may be exhibited.

According to the present embodiment, in the first system circuit L1, the power supply patterns P11 and P12 corresponding to the first layer power supply pattern portion and the ground pattern P13 corresponding to the second layer ground pattern portion are disposed so as to overlap with each other when viewed from the plate surface perpendicular direction. For that reason, a loop formed by the power supply patterns P11 and P12 and the ground pattern P13 is reduced when viewed from the plate surface perpendicular direction. For that reason, a loop formed by the power supply patterns P11 and P12 and the ground pattern P13 is reduced when viewed from the plate surface perpendicular direction.

In the second system circuit L2, the power supply patterns P21 and P22 corresponding to the first layer power supply pattern portion and the ground pattern P23 corresponding to the second layer ground pattern portion are disposed so as to overlap with each other when viewed from the plate surface perpendicular direction. For that reason, a loop formed by the power supply patterns P21 and P22 and the ground pattern P23 is reduced when viewed from the plate surface perpendicular direction.

In each system, both the loop-shaped patterns can be inhibited from functioning as an antenna. For that reason, the noise generated by the switching of the inverter circuit can be inhibited from being emitted as emission noise which is an electromagnetic wave. In addition to the switching noise described above, an electromagnetic wave noise caused by a large current flowing in both of the patterns is also inhibited by a reduction of the loop.

In the wiring of the power wiring patterns P12, P13, P22, and P23, the wiring may be thickened to lower an impedance in order to reduce a heat generation caused by a large current flow. When the wiring is thickened, a wiring width and a wiring gap may become large due to a substrate manufacturing restriction, and a fine wiring cannot be formed. For that reason, it may be unsuitable to wire the control wiring patterns P181, P182, P191, and P192 requiring a high density layout. Therefore, when both the power conversion circuit and the control circuit are provided on the same substrate to achieve miniaturization, the power wiring pattern and the control wiring pattern are mixed on the same substrate. Therefore, both a reduction in impedance and a miniaturization of wiring may be required.

According to the present embodiment, a multilayer substrate is used as the substrate 30 on which both the power wiring patterns P12, P13, P22, and P23 and the control wiring pattern P181, P182, P191, and P192 are provided. The power wiring patterns disposed in different layers of the multilayer substrate are electrically connected to each other by solid conductive members (solid vias 35) provided in the vias 35a.

This makes it possible to make the power wiring pattern of multiple layers have an impedance equivalent to that of a single layer of thick wiring. In addition, since the via is a solid via, the impedance can be further reduced as compared with the case of a film via. In other words, the impedance can be lowered without thickening the power wiring pattern, and heat generation caused by a large current flowing through the power wiring pattern can be reduced. In addition, since the power wiring pattern can be inhibited from being thickened, the wiring widths and wiring gaps of the control wiring patterns P181, P182, P191, and P192 can be reduced, and fine wiring can be achieved.

Second Embodiment

Figure 10:
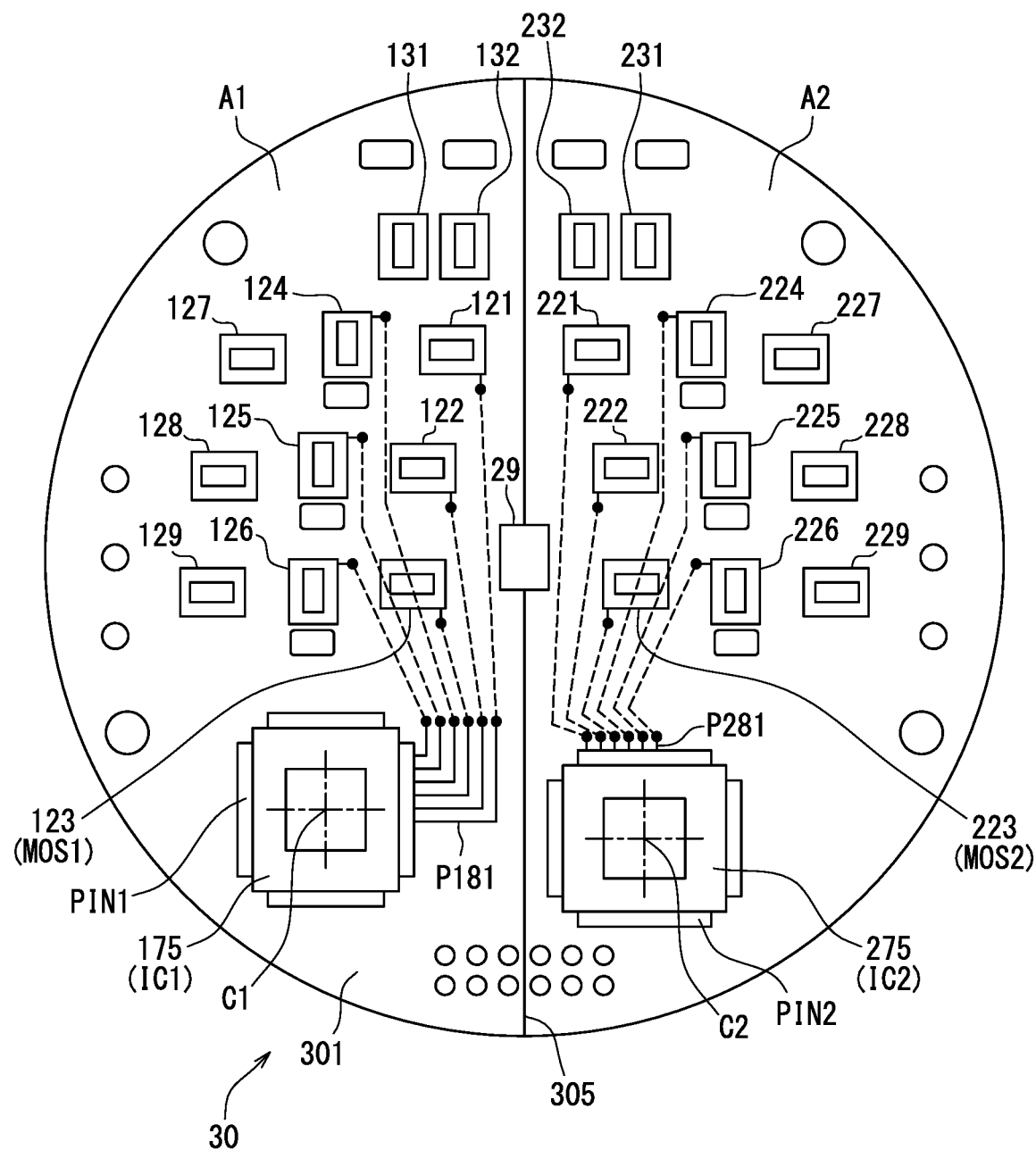
FIG. 10 is a diagram schematically showing a pattern of a printed wiring according to a second embodiment.
Figure 11:
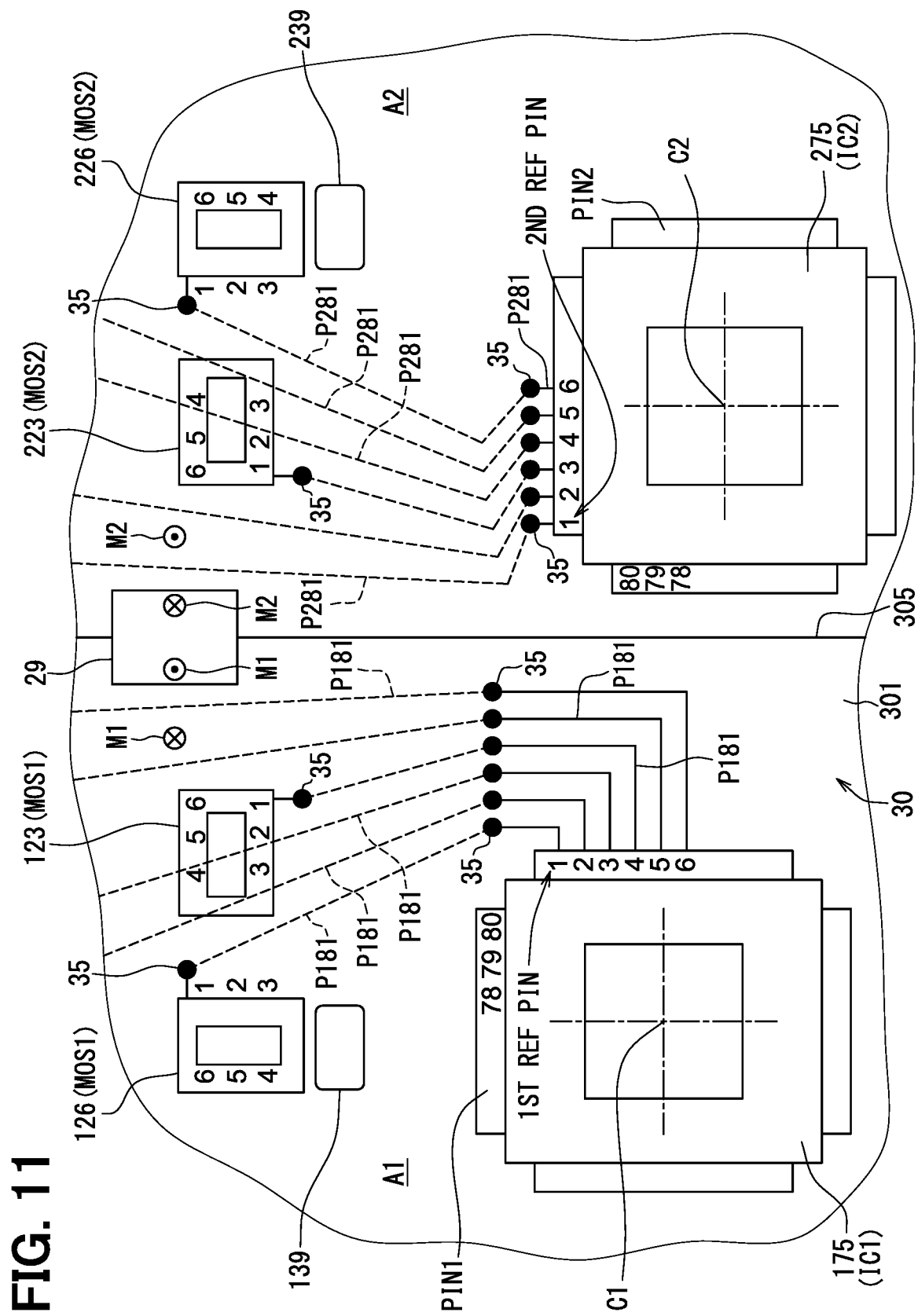
FIG. 11 is an enlarged view of FIG. 10.

In the first embodiment, the surface mount component SMD having the mirror inversion pin placement is employed as the first mount component and the second mount component. On the other hand, in the present embodiment, as shown in FIGS. 10 and 11, a surface mount component SMD having the same pin placement is employed for a first mount component and a second mount component. Specifically, a first pin placement is a placement in which pin numbers are sequentially assigned in a clockwise direction as viewed from a motor surface 301 side. A second pin placement is also a placement in which pin numbers are sequentially given in the clockwise direction as viewed from the motor surface 301 side in the same manner as that of the first pin placement.

In the first embodiment, a second mounting direction coincides with a direction obtained by mirror-inverting the first mounting direction. In the present embodiment, both the mount components are mounted so that the first mounting direction and the second mounting direction are different from each other.

In the first embodiment, the center point C2 of the second IC2 is located at a position where the center point C1 of the first IC1 is inverted with respect to the boundary line as a symmetry axis. In other words, the first IC1 and the second IC2 are disposed so as to have a positional relationship in which the first IC1 and the second IC2 are inverted with respect to the boundary line as a symmetry axis. On the other hand, in the present embodiment, the center point C2 of the second IC2 is located at a position different from the position obtained by inverting the center point C1 of the first IC1 with the boundary line as a symmetry axis. In other words, the first IC1 and the second IC2 are disposed in an asymmetric positional relationship.

In an example of FIG. 10, the first MOS1 and the second MOS2 are disposed so as to have a positional relationship in which the first MOS1 and the second MOS2 are inverted with respect to the boundary line as a symmetry axis, similarly to the first embodiment. The pin placements and the mounting directions of the first MOS1 and the second MOS2 are the same as those of the MOSs of the first embodiment.

As described above, according to the present embodiment, the following relationship is satisfied in the first IC1 used for the first system circuit L1 and the second IC2 used for the second system circuit L2. In other words, the first pin placement and the second pin placement are the same. The first mounting direction and the second mounting direction are different from each other.

This makes it possible to easily design the first patterns of the first system circuit L1 and the second patterns of the second system circuit L2 so as to approach the mirror-inverted shape and size. Therefore, the impedance variation of both the patterns in the first region A1 and the second region A2 can be inhibited, and the optimum heat radiation design can be promoted as described above. In addition, in the first region A1 and the second region A2, the emission noise variation of both the patterns can be inhibited, and the optimum noise countermeasure can be promoted as described above. Further, the magnetic flux M1 generated in the first region A1 and the magnetic flux M2 generated in the second region A2 can be promoted to cancel each other. Therefore, the emission noise emitted from the entire substrate 30 can be reduced.

Further, in the present embodiment, the first pin placement and the second pin placement are the same, and the first IC1 and the second IC2 are disposed in an asymmetric positional relationship. For that reason, the first patterns and the second patterns can be promoted to be designed to approach the mirror-inverted shape and size.

Third Embodiment

Figure 12:
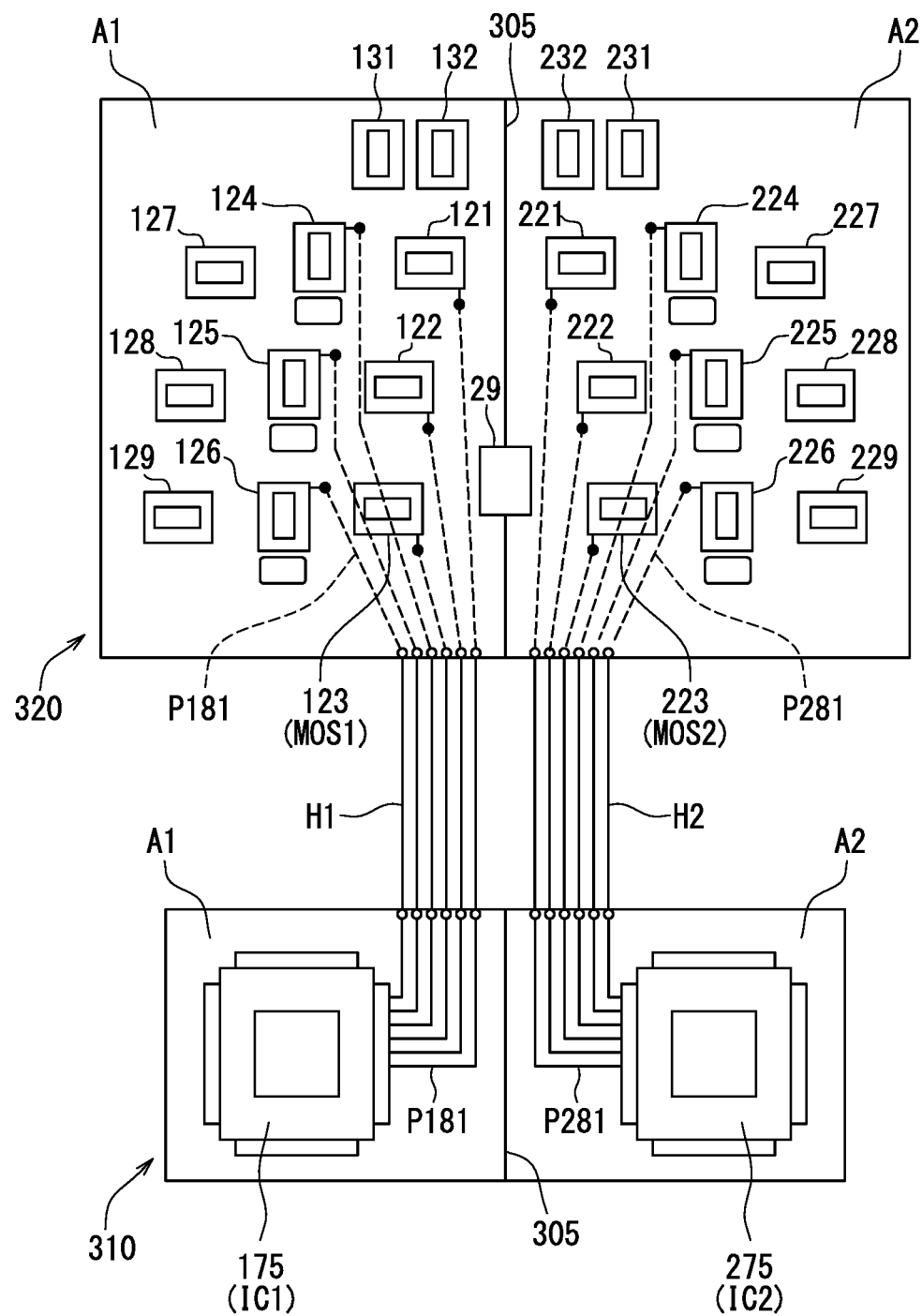
FIG. 12 is a diagram schematically showing a pattern of a printed wiring according to a third embodiment.

In the first embodiment, both the integrated circuit components (IC1, IC2) and the switching elements (MOS1, MOS2) are mounted on one substrate 30. In contrast, in the present embodiment, as shown in FIG. 12, a control substrate 310 on which integrated circuit components are mounted and a power substrate 320 on which switching elements are mounted are separately provided. In an example of FIG. 12, a rotation angle sensor 29 is mounted on a power substrate 320, but may be mounted on the control substrate 310.

Control wiring patterns P181 and P281 are provided on each of the control circuit substrate 310 and the power circuit substrate 320. Power wiring patterns are provided on the power substrate 320, and are not provided on the control substrate 310. The control wiring patterns P181 and P281 provided on the control substrate 310 and the control wiring patterns P181 and P281 provided on the power substrate 320 are connected to each other by harnesses H1 and H2.

As the first mount component and the second mount component mounted on the power substrate 320, surface mount components SMD having a mirror inversion pin placement are used in the same manner as in the first embodiment. In addition, as the first mount component and the second mount component mounted on the control substrate 310, the surface mount components SMD having the mirror inversion pin placement are also used.

Other Embodiments

Although multiple embodiments of the present disclosure have been described above, not only the combinations of the configurations explicitly shown in the description of each embodiment, but also the configurations of multiple embodiments can be partially combined even if the combination is not explicitly shown if there is no difficulty in the combination in particular. Unspecified combinations of the configurations described in the multiple embodiments and the modification examples are also disclosed in the following description.

In each of the above embodiments, the rectangular surface mount component SMD is mounted in a direction in which one side of a rectangle is parallel to the boundary line. The rectangular surface mount component SMD may be mounted in a direction in which all four sides of the rectangle intersect with the boundary line.

In each of the above embodiments, the number of pins of the first mount component and the second mount component is the same, and the number of pins used is also the same. Although the number of pins is the same, the number of pins used may be different.

The redundant circuit device according to each of the above embodiments is made redundant by two of the first system circuit L1 and the second system circuit L2, but may be made redundant by three or more systems of circuits.

In each of the above embodiments, the first mount component and the second mount component are surface mount components SMD to be surface mounted, but may be insertion mount components.

In an example of FIG. 12, both the control substrate 310 and the power substrate 320 are partitioned into a first region A1 and a second region A2. One of the control substrate 310 and the power substrate 320 may be partitioned into a first region A1 and a second region A2. Instead of making both the control circuit and the power conversion circuit redundant, one of the control circuit and the power conversion circuit may be made redundant and the other may not be made redundant.

In each of the above embodiments, the boundary line formed by the slit 305 is a straight line, but may be a combination of multiple straight lines, may be a curve, or may be a combination of a curve and a straight line.

In the first embodiment, the second mounting direction coincides with the direction in which the first mounting direction is mirror-inverted. The second mounting direction may be different from the first mounting direction.

In the first embodiment, the position of the second mount component on the substrate 30 coincides with the reversed position of the first mount component. The position of the second mount component may be different from the reversed position of the first mount component.

In each of the above embodiments, the rotation angle sensor 29 is located on the boundary line between the first region A1 and the second region A2. The rotation angle sensor 29 may be disposed at a position deviated from the boundary line. Further, the rotation angle sensor 29 may be attached to a part different from the substrate 30, or the rotation angle sensor 29 may be omitted.

In the example shown in FIG. 2, the opening 837a is provided in the rear frame end 837, and the rotation shaft 870 is inserted through the opening 837a. The magnet 875 attached to the tip of the rotation shaft 870 is exposed from the opening 837a and faces the rotation angle sensor 29. The opening 837a may be eliminated, and a part of the rear frame end 837 may be interposed between the rotation angle sensor 29 and the magnet 875. Even in this case, the rotation angle sensor 29 may be disposed on the center line Ax of the rotation shaft 870.

In the embodiment shown in FIG. 1, the power conversion device includes the motor 80 for the EPS 8 motor 80 as a power supply target. Another motor, such as a motor for vehicle travel, may be a power supply target. In the first embodiment, a circuit configuring the inverters 120 and 220 is applied to the power conversion circuit provided on the substrate 30, but a boosting circuit may be applied.

In the embodiment shown in FIG. 3, the switching elements 121 to 126, the motor relays 127 to 129, and the power supply relays 131 and 132 are all MOSFET. An IGBT, a thyristor, or the like may be used. The power supply relays 131 and 132 may be mechanical relays. Also, the second system circuit L2 may be an IGBT, a thyristor, or a mechanical relay instead of the MOSFET in the same manner as the first system circuit L1.

Although the embodiment shown in FIG. 3 includes an inter-system ground connection capacitor 41, the inter-system ground connection capacitor 41 may be eliminated. Although the embodiment shown in FIG. 3 includes electromechanical connection capacitors 142 and 242, those electromechanical connection capacitors 142 and 242 may be eliminated. In this case, it may be omitted that the ground pattern for each system or the power supply pattern for each system is divided and disposed in each region separated by the slit 305.

The inter-system ground connection capacitor 41 is mounted on the substrate 30 and electrically connects the ground of each system. This makes it possible to form a path for feeding back the noise propagated to the other system side through the motor windings 180 and 280 and the like to the host system circuit on the substrate 30. The electromechanical connection capacitors 142 and 242 connect the housing connection patterns 156, 157, 256, and 257 to the ground pattern of the substrate 30. This makes it possible to form a low-impedance path for feeding back the noises propagated to the motor 80 side to the ECU 10 including the inverters 120 and 220. Therefore, the propagation of noise to the outside of the drive device 1, such as a vehicle, can be reduced.

In the first embodiment, a control circuit is provided for each of the power conversion circuits of the two system circuits, and the control circuit is also configured in two system circuits. A control circuit may be common to each of the power conversion circuits of the two system circuits, and the control circuit may be configured as a single system circuit. In addition, all the circuits including the power conversion circuit may be configured as one system.

While various embodiments, configurations, and aspects of a redundant circuit device according to the present disclosure have been exemplified, the embodiments, configurations, and aspects of the present disclosure are not limited to those described above. For example, embodiments, configurations, and aspects obtained from an appropriate combination of technical elements disclosed in different embodiments, configurations, and aspects are also included within the scope of the embodiments, configurations, and aspects of the present disclosure.

What is claimed is:

1. A redundant circuit device including a first system circuit and a second system circuit having identical function to make the function be redundant, the redundant circuit device comprising:
   a substrate that is partitioned into a first region in which at least a part of the first system circuit is provided and a second region in which at least a part of the second system circuit is provided, and has one surface, each of the first region and the second region having a printed wiring;
   a first mount component that is included in the first system circuit, has three or more pins, and is surface-mounted on the one surface of the substrate; and
   a second mount component that is included in the second system circuit, has an identical number of pins as that of the first mount component and having an identical function as that of the first mount component, and is surface-mounted on the one surface of the substrate, wherein:
   a placement of numbers assigned by function to the respective pins of the first mount component with respect to a center point of the first mount component is defined as a first pin placement;
   a placement of numbers assigned by function to the respective pins of the second mount component with respect to a center point of the second mount component is defined as a second pin placement; and
   the second pin placement is a mirror inversion of the first pin placement.

2. The redundant circuit device according to claim 1, wherein:
   the pins of the first mount component include a first reference pin, which has a predetermined function;
   the pins of the second mount component include a second reference pin, which has the predetermined function;
   a direction of the first mount component on the substrate, which is specified by a position of the first reference pin around a center of the first mount component, is defined as a first mounting direction;
   a direction of the second mount component on the substrate, which is specified by a position of the second reference pin around a center of the second mount component, is defined as a second mounting direction; and
   the second mounting direction coincides with a mirror-inverted direction of the first mounting direction.

3. The redundant circuit device according to claim 1, wherein:
   a boundary line between the first region and the second region is a straight line; and
   from a direction perpendicular to a plate surface of the substrate, the center point of the second mount component is located at a position obtained by inverting the center point of the first mount component with respect to the boundary line as a symmetry axis.

4. The redundant circuit device according to claim 1, wherein:
   the first system circuit and the second system circuit control electric power to a motor having a rotation shaft;
   each of the first system circuit and the second system circuit includes a power conversion circuit that converts a supplied electric power to output the converted electric power to the motor; and
   each of the first system circuit and the second system circuit includes a control circuit that controls operation of the power conversion circuit.

5. The redundant circuit device according to claim 4, further comprising:
   a sensor element that is mounted on the one surface of the substrate, and detects a rotation angle of the rotation shaft,
   wherein:
   at least a part of the sensor element is positioned on a boundary line between the first region and the second region.

6. The redundant circuit device according to claim 4, wherein:
   the power conversion circuit includes a power wiring pattern;
   the control circuit includes a control wiring pattern; and
   the printed wiring provided on the substrate includes both the power wiring pattern and the control wiring pattern.

7. The redundant circuit device according to claim 4, wherein:
   each of the first mount component and the second mount component includes an integrated circuit component included in the control circuit.

8. The redundant circuit device according to claim 4, wherein:
   each of the first mount component and the second mount component includes a switching element included in the power conversion circuit.

9. A redundant circuit device including a first system circuit and a second system circuit having identical function to make the function be redundant, the redundant circuit device comprising:
   a substrate that is partitioned into a first region in which at least a part of the first system circuit is provided and a second region in which at least a part of the second system circuit is provided, and has one surface, each of the first region and the second region having a printed wiring;
   a first mount component that is included in the first system circuit, has three or more pins, and is surface-mounted on the one surface of the substrate; and
   a second mount component that is included in the second system circuit, has an identical number of pins as that of the first mount component and having an identical function as that of the first mount component, and is surface-mounted on the one surface of the substrate, wherein:
   a placement of numbers assigned by function to the respective pins included in the first mount component with respect to a center point of the first mount component is defined as a first pin placement;
   a placement of numbers assigned by function to the respective pins included in the second mount component with respect to a center point of the second mount component is defined as a second pin placement;
   the first pin placement is identical with the second pin placement;

the pins included in the first mount component has a first reference pin, which has a predetermined function;

the pins included in the second mount component has a second reference pin, which has the predetermined function;

a direction of the first mount component on the substrate, which is specified by a position of the first reference pin around a center of the first mount component, is defined as a first mounting direction;

a direction of the second mount component on the substrate, which is specified by a position of the second reference pin around a center of the second mount component, is defined as a second mounting direction; and the first mounting direction and the second mounting direction are different from each other.

10. The redundant circuit device according to claim 9, wherein:

a boundary line between the first region and the second region is a straight line; and from a direction perpendicular to a plate surface of the substrate, the center point of the second mount component is located at a position obtained by inverting the center point of the first mount component with respect to the boundary line as a symmetry axis.

11. The redundant circuit device according to claim 9, wherein:

the first system circuit and the second system circuit control electric power to a motor having a rotation shaft;

each of the first system circuit and the second system circuit includes a power conversion circuit that converts a supplied electric power to output the converted electric power to the motor; and each of the first system circuit and the second system circuit includes a control circuit that controls operation of the power conversion circuit.

12. The redundant circuit device according to claim 11, further comprising:

a sensor element that is mounted on the one surface of the substrate, and detects a rotation angle of the rotation shaft, wherein:

at least a part of the sensor element is positioned on a boundary line between the first region and the second region.

* * * * *